(12) United States Patent
Wang et al.

(10) Patent No.: US 12,101,908 B2
(45) Date of Patent: Sep. 24, 2024

(54) AIR CONDITIONING APPARATUS AND ELECTRIC CONTROL BOX

(71) Applicants: GD MIDEA HEATING & VENTILATING EQUIPMENT CO., LTD., Foshan (CN); MIDEA GROUP CO., LTD., Foshan (CN)

(72) Inventors: Mingren Wang, Foshan (CN); Zhijun Tan, Foshan (CN); Xihua Ma, Foshan (CN)

(73) Assignees: GD MIDEA HEATING & VENTILATING EQUIPMENT CO., LTD., Foshan (CN); MIDEA GROUP CO., LTD., Foshan (CN)

( * ) Notice: Subject to any disclaimer, the term of this patent is extended or adjusted under 35 U.S.C. 154(b) by 181 days.

(21) Appl. No.: 17/922,783

(22) PCT Filed: Aug. 24, 2021

(86) PCT No.: PCT/CN2021/114356
§ 371 (c)(1),
(2) Date: Nov. 1, 2022

(87) PCT Pub. No.: WO2022/042562
PCT Pub. Date: Mar. 3, 2022

(65) Prior Publication Data
US 2023/0164950 A1 May 25, 2023

(30) Foreign Application Priority Data

Aug. 26, 2020 (CN) .......................... 202021821860.9
Feb. 8, 2021 (CN) .......................... 202120368191.2

(51) Int. Cl.
*G06F 1/16* (2006.01)
*F24F 11/88* (2018.01)
(Continued)

(52) U.S. Cl.
CPC .......... *H05K 7/20272* (2013.01); *F24F 11/88* (2018.01); *F24F 11/89* (2018.01);
(Continued)

(58) Field of Classification Search
CPC .......... H05K 7/20272; H05K 7/20263; H05K 7/20254; H05K 7/20218; F24F 11/88;
(Continued)

(56) References Cited

U.S. PATENT DOCUMENTS 4,756,475 A * 7/1988 Vergne .................... F24H 9/148
237/56
5,333,460 A * 8/1994 Lewis ...................... G06F 1/20
62/297

(Continued)

FOREIGN PATENT DOCUMENTS

CN 201904714 U 7/2011
CN 106016507 A 10/2016
(Continued)

OTHER PUBLICATIONS

International search report and Written Opinion of the International Search Authority, International Application PCT/CN2021/114356, mailed Sep. 29, 2021(9 pages).

(Continued)

*Primary Examiner* — Anthony M Haughton

(57) ABSTRACT

The electric control box includes a box body, a mounting board, an electronic component, and a heat sink, the box body being provided with a mounting cavity; the mounting plate is disposed in the mounting cavity and the mounting cavity forms a first cavity and a second cavity located on the two sides of the mounting board; the electronic component is arranged in the second cavity; the heat sink comprises a heat exchange body and a header assembly; the header assembly is used for providing refrigerant flow to the heat (Continued)

exchange body; at least part of the heat exchange body is arranged in the first cavity, and is heat-conductively connected to the electronic component; the mounting board is used for blocking the condensed water on the heat sink from flowing into the second cavity.

13 Claims, 11 Drawing Sheets

(51) Int. Cl.
  *F24F 11/89* (2018.01)
  *F24F 13/22* (2006.01)
  *F24F 13/30* (2006.01)
  *H05K 5/00* (2006.01)
  *H05K 7/00* (2006.01)
  *H05K 7/20* (2006.01)
(52) U.S. Cl.
  CPC ............ *F24F 13/222* (2013.01); *F24F 13/30* (2013.01); *H05K 7/20263* (2013.01)
(58) Field of Classification Search
  CPC .......... F24F 11/89; F24F 13/222; F24F 13/30; F24F 13/22; G06F 1/20; G06F 1/203; G06F 1/206
  See application file for complete search history.

(56) References Cited

U.S. PATENT DOCUMENTS

| | | | | |
|---|---|---|---|---|
| 5,713,208 | A * | 2/1998 | Chen | ................... F25B 21/02 62/434 |
| 10,006,646 | B2 * | 6/2018 | Kim | ................... H05K 7/20927 |
| 11,304,336 | B2 * | 4/2022 | Kim | ................... H02M 3/003 |
| 2011/0271711 | A1 | 11/2011 | Yoshida et al. | |
| 2013/0126127 | A1 | 5/2013 | Yoshimura et al. | |
| 2014/0211923 | A1 * | 7/2014 | Chen | ................... H05G 1/02 378/147 |
| 2015/0198339 | A1 | 7/2015 | Jeon | |
| 2016/0174411 | A1 * | 6/2016 | Lee | ................... H05K 7/20254 165/80.5 |
| 2018/0142908 | A1 | 5/2018 | Morikawa et al. | |
| 2021/0112342 | A1 * | 4/2021 | Xu | ................... G06F 1/1626 |

FOREIGN PATENT DOCUMENTS

| | | |
|---|---|---|
| CN | 106016508 A | 10/2016 |
| CN | 106256176 A | 12/2016 |
| CN | 106852081 A | 6/2017 |
| CN | 107613721 A | 1/2018 |
| CN | 108361814 A | 8/2018 |
| CN | 109959182 A | 7/2019 |
| CN | 110145848 A | 8/2019 |
| CN | 210808085 U | 6/2020 |
| CN | 113710061 A | 11/2021 |
| CN | 214666271 U | 11/2021 |
| EP | 3361173 A1 | 8/2018 |
| JP | 2010078305 A | 4/2010 |
| JP | 5505055 B2 | 5/2014 |
| KR | 20180116679 A | 10/2018 |
| WO | 2012081056 A1 | 6/2012 |

OTHER PUBLICATIONS

European Search Report received in EP Application No. 21860397.5; mailed Feb. 23, 2024.
ISR received in PCT/CN2021/122414; mailed Dec. 30, 2021.
European Search Report received in EP Application No. 1860397.5; mailed Oct. 5, 2023.
European Search Report received in EP Application No. 21924234.4; mailed Jun. 12, 2024.

* cited by examiner

AIR CONDITIONING APPARATUS AND ELECTRIC CONTROL BOX

CROSS-REFERENCES TO RELATED APPLICATIONS

The present disclosure is a national phase application of International Application No. PCT/CN2021/114356, filed on Aug. 24, 2021, which claims the priority of the Chinese patent application No. 202021821860.9, filed on Aug. 26, 2020, the Chinese patent application No. 202120368191.2, filed on Feb. 8, 2021, the entireties of which are herein incorporated by reference.

FIELD

The present disclosure relates to the field of air conditioners, and in particular to an air conditioning apparatus and an electric control box.

BACKGROUND

Electronic elements are usually arranged inside an electric control box of an air conditioning apparatus. The electronic elements may operate to generate heat and cause a temperature inside the electric control box to be high. The cooling medium in a heat dissipation member inside the electric control box may reduce a temperature of the heat dissipation member.

When the air that is in the electric control box and is in a high temperature contacts the heat dissipation member, the air may be condensed into water. When the condensed water flows to a location where the electronic elements are arranged, the electronic elements may be short-circuited or damaged, or in more serious cases, a fire may be caused.

SUMMARY

According to some embodiments of the present disclosure, an electric control box is provided and includes: a box body, defining a mounting cavity; a mounting plate, received in the mounting cavity to divide the mounting cavity into a first chamber and a second chamber, and the first chamber and the second chamber are disposed on two sides of the mounting plate respectively; an electronic element, received in the second cavity; and a heat dissipation member, comprising a heat exchanging body and a fluid-collecting tube assembly, and the fluid-collecting tube assembly is configured to provide a cooling medium to the heat exchanging body, at least part of the heat exchanging body is received in the first cavity and is thermal-conductively connected to the electronic element, the mounting plate is configured to prevent condensed water on the heat dissipation member from flowing into the second cavity.

According to another embodiment of the present disclosure, an air conditioning apparatus is provided and includes an air conditioning body and the electric control box as described in the above. The electric control box is detachably connected to the air conditioning body.

BRIEF DESCRIPTION OF THE DRAWINGS

The accompanying drawings are incorporated with the specification and form a part of the specification. The drawings illustrate embodiments in accordance with the present disclosure. The drawings and the specification are cooperatively described to illustrate embodiments of the present disclosure.

DETAILED DESCRIPTION OF THE DISCLOSURE

Embodiments of the present disclosure will be clearly and completely described below by referring to the accompanying drawings in the embodiments of the present disclosure. Apparently, the embodiments described are only a part of but not all of the embodiments of the present disclosure.

The term "embodiment" in the present disclosure means that particular features, structures or properties described in an embodiment may be included in at least one embodiment of the present disclosure. The presence of the term in various sections of the specification does not necessarily mean a same embodiment, nor a separate or some embodiment that is mutually exclusive with other embodiments.

Figure 1:
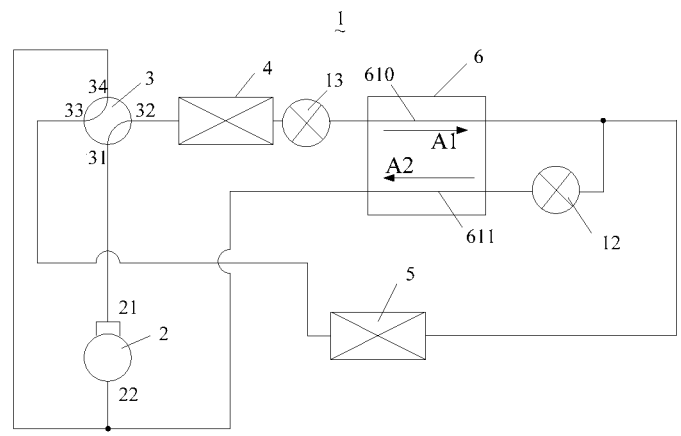
FIG. 1 is a structural schematic view of an air conditioning system according to an embodiment of the present disclosure.

As shown in FIG. 1, FIG. 1 is a structural schematic view of an air conditioning system according to an embodiment of the present disclosure. As shown in FIG. 1, the air conditioning system 1 may include a compressor 2, a four-way valve 3, an outdoor heat exchanger 4, an indoor heat exchanger 5, a heat exchanger 6, an expansion valve 12 and another expansion valve 13. The another expansion valve 13 and the heat exchanger 6 are disposed between the outdoor heat exchanger 4 and the indoor heat exchanger 5. The compressor 2 provides a circulating cooling medium flowing between the outdoor heat exchanger 4 and the indoor heat exchanger 5 through the four-way valve 3.

The heat exchanger 6 includes a first heat exchanging channel 610 and a second heat exchanging channel 611. A first end of the first heat exchanging channel 610 is connected to the outdoor heat exchanger 4 via the another expansion valve 13. A second end of the first heat exchanging channel 610 is connected to the indoor heat exchanger 5. A first end of the second heat exchanging channel 611 is connected to the second end of the first heat exchanging channel 610 via the expansion valve 12, and a second end of the second heat exchanging channel 611 is connected to an air intaking port 22 of the compressor 2.

When the air conditioning system 1 is in refrigerating, a flowing path of the cooling medium is shown in the following.

An air outputting port 21 of the compressor 2—a connection port 31 of the four-way valve 3—a connection port 32 of the four-way valve 3—the outdoor heat exchanger 4—the heat exchanger 6—the indoor heat exchanger 5—a connection port 33 of the four-way valve 3—a connection port 34 of the four-way valve 3—the air intaking port 22 of the compressor 2.

A flowing path of the cooling medium in the first heat exchanging channel 610 (a primary path) is as follows: the first end of the first heat exchanging channel 610—the second end of the first heat exchanging channel 610—the indoor heat exchanger 5. A flowing path of the cooling medium in the second heat exchanging channel 611 (a secondary path) is as follows: the second end of the first heat exchanging channel 610—the expansion valve 12—the first end of the second heat exchanging channel 611—the second end of the second heat exchanging channel 611—the air intaking port 22 of the compressor 2.

For example, in the above case, a working principle of the air conditioning system 1 may be as follows. The outdoor heat exchanger 4 serves as a condenser, and outputs a cooling medium having a medium pressure and a medium temperature (a liquid phase cooling medium having a temperature of 40°) via the another expansion valve 13. The cooling medium in the first heat exchanging channel 610 has a medium pressure and a medium temperature. The expansion valve 12 converts the cooling medium flow having the medium pressure and the medium temperature into a cooling medium having a low pressure and a low temperature (the cooling medium may be in a two phase of gas and liquid, and may have a temperature of 10°). The cooling medium in the second heat exchanging channel 611 may have a low pressure and a low temperature. The low-pressure and low-temperature cooling medium in the second heat exchanging channel 611 absorbs heat from the medium-pressure and medium-temperature cooling medium in the first heat exchanging channel 610, and the cooling medium in the second heat exchanging channel 611 is gasified to sub-cool the cooling medium in the first heat exchanging channel 610. The gasified cooling medium in the second heat exchanging channel 611 blasts air to the compressor 2 to increase enthalpy, increasing a refrigerating capacity of the air conditioning system 1.

The expansion valve 12 serves as a flow adjustment component for the second heat exchanging channel 611 and adjusts the amount of the cooling medium flowing in the second heat exchanging channel 611. Heat exchange may be performed between the cooling medium flowing in the first heat exchanging channel 610 and the cooling medium flowing in the second heat exchanging channel 611 to sub-cool the cooling medium flowing in the first heat exchanging channel 610. Therefore, the heat exchanger 6 may act as an economizer for the air conditioning system 1, increasing a degree of subcooling, further increasing a heat exchanging efficiency of the air conditioning system 1.

Further, in a heating mode, the connection port 31 of the four-way valve 3 is connected to the connection port 33, and the connection port 32 of the four-way valve 3 is connected to the connection port 34. The cooling medium output from air outputting port 21 of the compressor 2 flows from the indoor heat exchanger 5 to the outdoor heat exchanger 4 and takes the indoor heat exchanger 5 as the condenser. In this case, the cooling medium output from the indoor heat exchanger 5 is divided into two paths. For one of the two paths, the cooling medium enters the first heat exchanging channel 610 (the primary path). For the other one of the two paths, the cooling medium enters the second heat exchanging channel 611 (the secondary path) via the expansion valve 12. The cooling medium of the second heat exchanging channel 611 may sub-cool the cooling medium of the first heat exchanging channel 610. The cooling medium that flows through the second heat exchanging channel 611 supplies air for the compressor 2 to increase enthalpy to improve a heating capacity of the air conditioner.

According to the present disclosure, the overall structure of the air conditioning system 1 as described above are optimized in the following embodiments.

1. Micro-Channel Heat Exchanger

Figure 2:
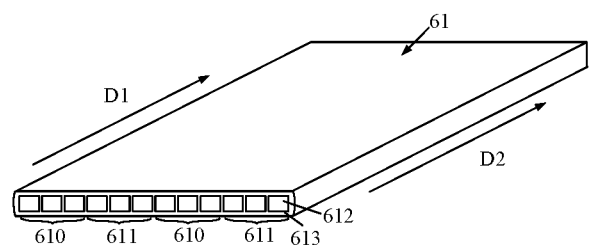
FIG. 2 is a structural schematic view of a heat exchanging body of a heat exchanger shown in FIG. 1.

As shown in FIG. 2, the heat exchanger 6 includes a heat exchanging body 61. The heat exchanging body 61 defines micro-channels 612. The micro-channels 612 include a first micro-channel and a second micro-channel. The first micro-channel serves as the first heat exchanging channel 610 of the heat exchanger 6, and the second micro-channel serves as the second heat exchanging channel 611 of the heat exchanger 6. Therefore, the first micro-channel 610 and the first heat exchanging channel 610 are indicated by a same reference numeral, and the second micro-channel 611 and the second heat exchanging channel 611 are indicated by a same reference numeral.

The heat exchanging body 61 may include a single plate body 613. The plate body 613 defines micro-channels 612. The micro-channels 612 of the plate body 613 include first micro-channels 610 and second micro-channels 611, and the first micro-channels 610 and the second micro-channels 611 are arranged alternately. The first micro-channel 610 extends along an extension direction D1, the second micro-channel 610 extends along an extension direction D2, and the extension direction D1 is parallel to the extension direction D2. For example, the extension direction D1 of the first micro-channel 610 is the same as the extension direction D2 of the second micro-channel 611. The plate body 613 may be a flat tube, and heat dissipation elements or electronic elements may be arranged on the plate body 613. In some embodiments, the plate body 613 may be a carrier having a cross section in other shapes, such as having a cylinder cross section, a rectangular cross section, a square cross section, and so on. In some embodiments, as described in the following, the heat exchanging body 61 may include at least two plate bodies or two tube bodies. The two plate bodies may be laminated with each other. For the two tube bodies, one of the two tube bodies may sleeve the other tube bodies.

For each micro-channel 612, the micro-channel 612 may have a cross section perpendicular to the extension direction of the micro-channel 612, and the cross section may be rectangular. A side length of the micro-channel may be 0.5 mm-3 mm. For each micro-channel 612, a distance between the micro-channel 612 and a surface of the plate body 613 may be 0.2 mm-0.5 mm, and a distance between two adjacent micro-channels 612 may be 0.2 mm-0.5 mm, and the micro-channels 612 may meet requirements of pressure resistance and heat exchanging performance. In some embodiments, the cross section of the micro-channel 612 may be in other shapes, such as circular, triangular, trapezoidal, oval or irregular.

For example, when the air conditioning system shown in FIG. 1 is in the refrigerating mode, the first cooling medium (i.e., the cooling medium having the medium pressure and the medium temperature) flows through the first micro-channels 610, and the second cooling medium (i.e., the cooling medium having the low pressure and the low temperature) flows through the second micro-channels 611. The first cooling medium may be a liquid phase medium, and the second cooling medium may be a medium in two phases of liquid and gas. While the second cooling medium flowing along the second micro-channels 611, the second cooling medium absorbs heat from the first cooling medium flowing in the first micro-channels 610 to sub-cool the first cooling medium.

To be noted that, the heat exchanger having the micro-channels as described in the above and in the following may not be limited to the application scenarios shown in FIG. 1. Therefore, the terms "first" and "second" in the first micro-channel 610, the second micro-channel 611, the first cooling medium and the second cooling medium are used to distinguish different micro-channels and different cooling media only, and shall not be interpreted as limiting specific applications of the micro-channels and the cooling media. For example, in other embodiments or other operating modes, the first cooling medium flowing through the first micro-channels 610 may absorb heat from the second cooling medium flowing through the second micro-channels 611. Further, the first cooling medium and the second cooling medium may not be limited as being in the liquid phase or the liquid-gas phase as described in the above.

As shown in FIG. 1, a flowing direction A1 of the first cooling medium is opposite to a flowing direction A2 of the second cooling medium, and there is a large temperature difference between a temperature of the first cooling medium and a temperature of the second cooling medium, and the heat exchanging efficiency between the first cooling medium and the second cooling medium may be improved.

In some embodiments, the flowing direction A1 of the first cooling medium may be the same as or perpendicular to the flowing direction A2 of the second cooling medium.

In some embodiments, the heat exchanging body 61 may include at least two sets of first micro-channels 610 and second micro-channels 611. One set of the at least two sets of first micro-channels 610 and second micro-channels 611 are spaced apart from another set of the at least two sets of first micro-channels 610 and second micro-channels 611 in the direction perpendicular to the extension direction D1. As shown in FIG. 2, the direction perpendicular to the extension direction D1 may be a width direction of the plate body 613. In some embodiments, the direction perpendicular to the extension direction D1 may be a thickness direction of the plate body 613. For example, the first predetermined number of micro-channels may be selected from the plurality of micro-channels 612 and may be determined as the first micro-channels 610, and the second predetermined number of micro-channels may be selected from the plurality of micro-channels 612 and determined as the second micro-channels 611. Sets of the first micro-channels 610 and sets of the second micro-channels 611 are arranged alternately. That is, a second micro-channel 611 is arranged between the two sets of the first micro-channels 610, and a first micro-channel 610 is arranged between the two sets of the second micro-channels 611, and the at least two sets of the first micro-channels 610 are spaced apart from each other, and the at least two sets of the second micro-channels 611 are spaced apart from each other. In this way, the heat exchanger 6 having the first micro-channels 610 and the second micro-channels 611 arranged alternately may be formed, as shown in FIG. 2. The first predetermined number and the second predetermined number may be equal, such as 3. In some embodiments, the first predetermined number may be different from the second predetermined number, such as the first predetermined number being 3, and the second predetermined number being 2.

In some embodiments, each of the first predetermined number and the second predetermined number may be 1. One of the plurality of micro-channels 612 is the first micro-channel 610, and one micro-channel that is arranged adjacent to the first micro-channel 610 may be the second micro-channel 611.

For example, the heat exchanging body 61 may have 10*10 micro-channels 612. An area of the cross section of the heat exchanging body 61 is the same as an area of a conventional channel. An equal mass and an equal amount of the cooling medium may flow through each of the 10*10 micro-channels 612 and the conventional channel. A characteristic length Dh of each of the 10*10 micro-channels 612 is 1/10 of a characteristic length of the conventional channel, and a pressure drop is proportional to L/(Dh2). When the micro-channel and the conventional channel have a same pressure drop, a length L of the micro-channel 612 may be 1/100 of a length of the conventional channel.

An effective heat exchanging area of the micro-channel 612 may be 1/10 of an effective heat exchanging area of the conventional channel. According to a formula: a heat exchanging coefficient*the characteristic length=a constant, the heat exchanging coefficient of the micro-channel 612 may be 10 times of the heat exchanging coefficient of the conventional channel. According to the formula: the amount of exchanged heat=heat exchanging coefficient*a heat exchanging area, the amount of exchanged heat of the micro-channel 612 may be equal to the amount of exchanged heat of the conventional channel. Therefore, when the length of the 10*10 micro-channels 612 may be 1/100 of the length of conventional channel, the micro-channels and the conventional channel may satisfy a same heat loading requirement.

According to the above embodiments, the heat exchanging body 61 defines the plurality of first micro-channels 610 and the plurality of second micro-channels 611 to reduce a length of the heat exchanging body 61. A size of the heat exchanger 6 may be reduced, and the amount of exchanged heat of the heat exchanger 6 may be the same as the amount of exchanged heat of the economizer.

Figure 3:
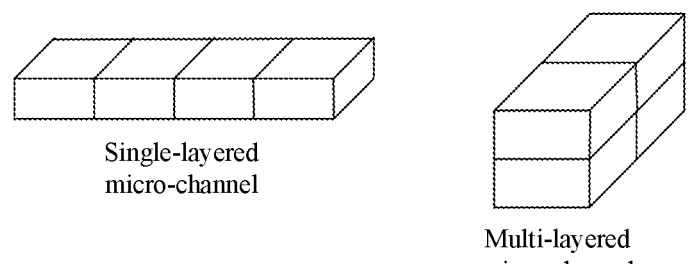
FIG. 3 is a structural schematic view of single-layered micro channels and multi-layered micro channel shown in FIG. 2.

As shown in FIG. 3, the plurality of micro-channels 612 may be configured as single-layered micro-channels or multi-layered micro-channels. In FIG. 3, an area of a cross section of the multi-layered micro-channels is four times of an area of a cross section of the single-layered micro-channel, and a length of the single-layered micro-channels is four times of a length of the multi-layered micro-channels. When a mass and an amount of the cooling medium flows through the single-layered micro-channels is equal to a mass and an amount of the cooling medium flows through the multi-layered micro-channels, a flowing speed of the cooling medium in the multi-layered micro-channels may be ¼ of a flowing speed of the cooling medium in the single-layered micro-channels.

When the cooling medium is in a laminar flowing state, a pressure drop of the multi-layered micro-channels may be 1/16 of a pressure drop of the single-layered micro-channels. Since the heat exchanging coefficient*the characteristic length=the constant, when the characteristic length remains unchanged, when the heat exchanging coefficient remains unchanged, and when a heat exchanging area of the single-layered micro-channels and a heat exchanging area of the multi-layered micro-channels remain unchanged, the amount of the exchanged heat of the single-layered micro-channels may be equal to the amount of the exchanged heat of the multi-layered micro-channels. Therefore, when the cooling medium is flowing at a low flowing speed and is in the laminar flowing state, the larger the area of the cross section of the plurality of micro-channels 612, the shorter the length of the plurality of micro-channels 612, and a flow resistance loss of the cooling medium may be reduced.

When the cooling medium is in a turbulent flowing state, the pressure drop of the multi-layered micro-channel may be 1/48 of the pressure drop of the single-layered micro-channels. In this case, the heat exchanging coefficient has a functional relationship with the flowing speed of the cooling medium. The higher the flowing speed of the cooling medium, the greater the heat exchanging coefficient. Therefore, the amount of the exchanged heat of the single-layered micro-channels may be greater than the amount of the exchanged heat of the multi-layered micro-channels. In summary, when the amount of the exchanged heat can be satisfied, the area of the cross section of the plurality of micro-channels 612 may be larger to reduce the flow resistance loss of the cooling medium.

1.1 Fluid-Collecting Tube Assembly

Figure 4:
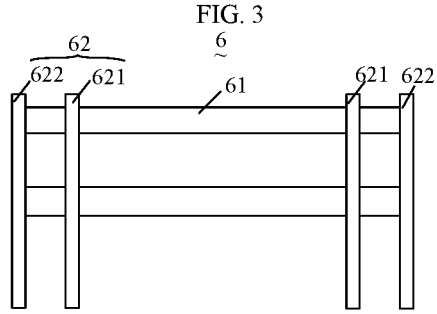
FIG. 4 is a structural schematic view of a fluid-collecting tube assembly in the heat exchanger shown in FIG. 1 according to an embodiment of the present disclosure.

As shown in FIG. 4, the heat exchanger 6 may further include a fluid-collecting tube assembly 62. The fluid-collecting tube assembly 62 and the heat exchanger body 61 may be arranged horizontally. For example, the fluid-collecting tube assembly 62 and the heat exchanger body 61 may be arranged along a horizontal plane. In some embodiments, the fluid-collecting tube assembly 62 may be arranged vertically. That is, the fluid-collecting tube assembly 62 is arranged in a direction perpendicular to the horizontal plane (i.e., in a gravitational direction), and the heat exchanger body 61 is arranged horizontally. In some embodiments, the fluid-collecting tube assembly 62 is arranged vertically, and the heat exchanger body 61 is arranged vertically. In some embodiments, the fluid-collecting tube assembly 62 is arranged horizontally, and the heat exchanger body 61 is arranged vertically.

The fluid-collecting tube assembly 62 may include a first fluid-collecting tube 621 and a second fluid-collecting tube 622. The first fluid-collecting tube 621 has a first fluid-collecting channel, and the second fluid-collecting tube 622 has a second fluid-collecting channel. The heat exchanger 6 has a cross section along a direction that the cooling medium (the first cooling medium or the second cooling medium) flows in the heat exchanging body 61, and the cross section is I shaped. In some embodiments, the cross section may be L shaped, U shaped, G shaped, circular, and so on.

The first fluid-collecting channel is communicated with the first micro-channel 610, and the first cooling medium may be provided to the first micro-channel 610 through the first fluid-collecting channel; and/or the first cooling medium that flows through the first micro-channel 610 may be collected. In the present embodiment, two first fluid-collecting tubes 621 are arranged and are connected to two ends of the first micro-channel 610 respectively. In this way, the first cooling medium may be provided to the first micro-channel 610 through the one of the two first fluid-collecting tubes 621, and the first cooling medium that flows through the first micro-channel 610 may be collected through the other one of the two first fluid-collecting tubes 621.

For example, in the air conditioning system shown in FIG. 1, the first end of the first micro-channel 610 is connected to the outdoor heat exchanger 4 through one of the two first fluid-collecting tubes 621 via the expansion valve 13. In this way, in the refrigerating mode, the first cooling medium may be provided to the first micro-channel 610. The second end of the first micro-channel 610 is connected to the indoor heat exchanger 5 through the other one of the two first fluid-collecting tubes 621, and the first cooling medium flowing through the first micro-channel 610 may be collected. In the heating mode, since the first cooling medium may flow in the first micro-channel 610 in an opposite direction, functions of the two first fluid-collecting tubes 621 may be interchanged compared to the functions in the refrigerating mode.

The second fluid-collecting channel is communicated with the second micro-channel 611, and the second cooling medium may be provided to the second micro-channel 611 through the second fluid-collecting channel; and/or the second cooling medium that flows through the second micro-channel 611 may be collected. In the present embodiment, two second fluid-collecting tubes 622 are arranged and are connected to two ends of the second micro-channel 611 respectively. In this way, the second cooling medium may be provided to the second micro-channel 611 through the one of the two second fluid-collecting tubes 622, and the second cooling medium that flows through the second micro-channel 611 may be collected through the other one of the two second fluid-collecting tubes 622.

For example, in the air conditioning system shown in FIG. 1, the first end of the second micro-channel 611 is connected to the expansion valve 12 through one of the two second fluid-collecting tubes 622 to provide the second cooling medium to the second micro-channel 611. The second end of the second micro-channel 611 is connected to the air intaking port 22 of the compressor 2 through the other one of the two second fluid-collecting tubes 622 to collect the second cooling medium flowing through the second micro-channel 611.

In an embodiment, for the at least two sets of first micro-channels 610 and second micro-channels 611, same ends of the first micro-channels 610 are connected to one first fluid-collecting tube 621; and same ends of the second micro-channels 611 are connected to one second fluid-collecting tube 622. That is, the same ends of all first micro-channels 610 of the heat exchanger 6 are connected to one first fluid-collecting tube 621, and the same ends of all the second micro-channels 611 of the heat exchanger 6 are connected to one second fluid-collecting tube 622. In this way, a corresponding fluid-collecting tube may not be arranged for each of the micro-channels, and costs may be reduced.

According to the embodiment shown in FIG. 4, since the extension direction D1 of the first micro-channel 610 is parallel to the extension direction D2 of the second micro-channel 611, an extension direction of the first fluid-collecting tube 621 is parallel to the extension direction of the second fluid-collecting tube 622. However, in some embodiments, the extension directions of the first fluid-collecting tube 621 and the second fluid-collecting tube 622 may be adjusted based on the extension directions of the first micro-channel 610 and the second micro-channel 611. For example, the extension direction of the first fluid-collecting tube 621 may be perpendicular to the extension direction of the second fluid-collecting tube 622.

1.2 First Fluid-Collecting Tube Being Spaced Apart From Second Fluid-Collecting Tube As shown in FIG. 4, the first fluid-collecting tube 621 is spaced apart from the second fluid-collecting tube 622 along the extension direction of the heat exchanging body 61. The extension direction of the heat exchanging body 61 is the same as the extension direction D1 of the first micro-channel 610 and the extension direction D2 of the second micro-channel 611. The second micro-channel 611 extends through the first fluid-collecting tube 621 and is connected to the second fluid-collecting tube 622. The first fluid-collecting tube 621 is disposed between the second fluid-collecting tube 622 and the heat exchanging body 61. The second micro-channel 611 extends through the first fluid-collecting tube 621 and is inserted into and welded with the second fluid-collecting tube 622. The first micro-channel 610 is inserted into and welded with the first fluid-collecting tube 621. In some embodiments, the first micro-channel 610 may extend through the second fluid-collecting tube 622 and is further inserted into the first fluid-collecting tube 621.

A distance between the first fluid-collecting tube 621 and the second fluid-collecting tube 622 is R-2R. The R is a maximum cross-sectional dimension of the first fluid-collecting tube 621 along a spacing direction of the first fluid-collecting tube 621 and the second fluid-collecting tube 622. Each of the cross section of the first fluid-collecting tube 621 and the cross section of the second fluid-collecting tube 622 may be circular. The R may be a diameter of the first fluid-collecting tube 621 or a diameter of the second fluid-collecting tube 622. In some embodiments, the cross section of the first fluid-collecting tube 621 and the cross section of the second fluid-collecting tube 622 may be in other shapes, such as oval, square, rectangular or irregular. When the cross section of the first fluid-collecting tube 621 and the cross section of the second fluid-collecting tube 622 are not circular, the R is a diameter of a circumcircle of the first fluid-collecting tube 621 or a diameter of a circumcircle of the second fluid-collecting tube 622.

Therefore, the distance between the first fluid-collecting tube 621 and the second fluid-collecting tube 622 may be set to be large, and the first fluid-collecting tube 621 may be easily welded to the heat exchanging body 61, and the second fluid-collecting tube 622 may be easily welded to the heat exchanging body 61. In addition, heat exchange is not performed between the second micro-channel 611, which is disposed between the first fluid-collecting tube 621 and the second fluid-collecting tube 622, and the first micro-channel 610. When the distance between the first fluid-collecting tube 621 and the second fluid-collecting tube 622 is small, the length of the second micro-channel 611 disposed between the first fluid-collecting tube 621 and the second fluid-collecting tube 622 may be reduced, and the heat exchanging area of the second micro-channel 611 may be increased.

In some embodiments, the first fluid-collecting tube 621 and the second fluid-collecting tube 622 may be welded to reduce the distance between the first fluid-collecting tube 621 and the second fluid-collecting tube 622.

In addition, the first micro-channel 610 may be connected to the first fluid-collecting tube 621 by avoiding the second fluid-collecting tube 622. For example, the first micro-channel 610 may be arranged at an outside of the second fluid-collecting tube 622, and the first micro-channel 610 may be connected to the first fluid-collecting tube 621 by avoiding the second fluid-collecting tube 622. In some embodiments, the second micro-channel 611 may be connected to the second fluid-collecting tube 622 by avoiding the first fluid-collecting tube 621.

1.3 Dividing Master Fluid-Collecting Tube Into Two Fluid-Collecting Tubes

Figure 5:
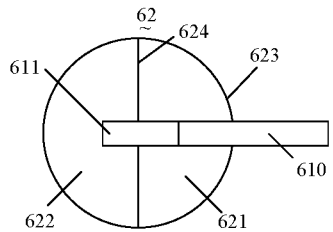
FIG. 5 is a structural schematic view of a fluid-collecting tube assembly in the heat exchanger shown in FIG. 1 according to another embodiment of the present disclosure.

As shown in FIG. 5, the manifold fluid-collecting tube assembly 62 includes a master fluid-collecting tube 623 and a flow divider 624. The flow divider 624 is arranged inside the master fluid-collecting tube 623 for dividing the master fluid-collecting tube 623 into the first fluid-collecting tube 621 and the second fluid-collecting tube 622. That is, the master fluid-collecting tube 623 is configured as the first fluid-collecting tube 621 and the second fluid-collecting tube 622 separated by the flow divider 624. In this case, as shown in FIG. 5, the first micro-channel 610 extends through a side wall of the master fluid-collecting tube 623 and is inserted into the first fluid-collecting tube 621, and the second micro-channel 611 extends through the side wall of the master fluid-collecting tube 623 and the flow divider 624 and is inserted into the second fluid-collecting tube 622. In some embodiments, the second micro-channel 611 extends through the side wall of the master fluid-collecting tube 623 and is inserted into the second fluid-collecting tube 622, and the first micro-channel 610 extends through the side wall of the master fluid-collecting tube 623 and the flow divider 624 and is inserted into the first fluid-collecting tube 621. Compared to the fluid-collecting tube assembly 62 shown in FIG. 4, in the present embodiment, one master fluid-collecting tube 623 is arranged to achieve functions of both the first fluid-collecting tube 621 and the second fluid-collecting tube 622, and costs and a size of the fluid-collecting tube assembly 62 may be reduced.

In some embodiments, the master fluid-collecting tube 623 is divided into two first fluid-collecting tubes 621 or two second fluid-collecting tubes 622 by the flow divider 624. In this case, an end of the first micro-channel 610 extends through the side wall of the master fluid-collecting tube 623 and is inserted into one of the two first fluid-collecting tubes 621, and the other end of the first micro-channel 610 extends through the side wall of the master fluid-collecting tube 623 and is inserted into the other one of the two first fluid-collecting tubes 621. One of the two first fluid-collecting tubes 621 is configured to provide the first cooling medium to the first micro-channel 610, and the other of the two first fluid-collecting tubes 621 is configured to collect the first cooling medium flow through the first micro-channel 610. In this case, the first micro-channel 610 may have a U-shaped flowing path.

In some embodiments, an end of the second micro-channel 611 extends through the side wall of the master fluid-collecting tube 623 and is inserted into one of the two second fluid-collecting tubes 622, and the other end of the second micro-channel 611 extends through the side wall of the master fluid-collecting tube 623 and the flow divider 624 and is inserted into the other one of the two second fluid-collecting tubes 622. One of the two second fluid-collecting tubes 622 is configured to provide the second cooling medium to the second micro-channel 611, and the other of the two second fluid-collecting tubes 622 is configured to collect the second cooling medium flowing through the second micro-channel 611. In this case, the second micro-channel 611 may have a U-shaped flowing path.

Figure 6:
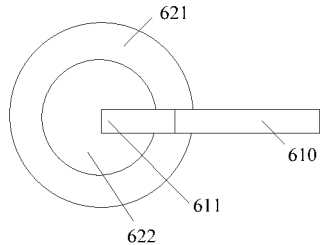
FIG. 6 is a structural schematic view of a fluid-collecting tube assembly in the heat exchanger shown in FIG. 1 according to still another embodiment of the present disclosure.

1.4 First Fluid-Collecting Tube Sleeving or Being Sleeved by Second Fluid-Collecting Tube As shown in FIG. 6, a diameter of the second fluid-collecting tube 622 is smaller than a diameter of the first fluid-collecting tube 621. The first fluid-collecting tube 621 sleeves an outside of the second fluid-collecting tube 622. The first micro-channel 610 extends through the side wall of the first fluid-collecting tube 621 and is inserted into the first fluid-collecting tube 621. The second micro-channel 611 extends through the side wall of the first fluid-collecting tube 621 and the side wall of the second fluid-collecting tube 622 and is inserted into the second fluid-collecting tube 622. In some embodiments, the second fluid-collecting tube 622 may sleeve an outside of the first fluid-collecting tube 621. In this case, the second micro-channel 611 extends through the side wall of the second fluid-collecting tube 622 and is inserted into the second fluid-collecting tube 622. The first micro-channel 610 extends through the side wall of the second fluid-collecting tube 622 and the side wall of the first fluid-collecting tube 621 and is inserted into the first fluid-collecting tube 621.

Compared to the fluid-collecting tube assembly 62 shown in FIG. 4, in the present embodiment, the sleeving allows the size of the fluid-collecting tube assembly 62 to be reduced.

In some embodiments, the two first fluid-collecting tubes 621 may be sleeved within each other, or the two second fluid-collecting tubes 622 may be sleeved within each other. In this case, an end of the first micro-channel 610 extends through the side wall of an outer first fluid-collecting tube 621 and is inserted into the outer first fluid-collecting tube 621. The other end of the first micro-channel 610 extends through the side wall inside the two first fluid-collecting tubes 621 and is inserted into an inner first fluid-collecting tube 621. The outer first fluid-collecting tube 621 is configured to provide the first cooling medium to the first micro-channel 610, and the inner first fluid-collecting tube 621 is configured to collect the first cooling medium flowing through the first micro-channel 610. In one embodiment, the inner first fluid-collecting tube 621 is configured to provide the first cooling medium to the first micro-channel 610, and the outer first fluid-collecting tube 621 is configured to collect the first cooling medium flowing through the first micro-channel 610. In this case, the first micro-channel 610 may have a U-shaped flowing path.

In one embodiment, an end of the second micro-channel 611 extends through the side wall of an outer second fluid-collecting tube 622 and is inserted into the outer second fluid-collecting tube 622. The other end of the second micro-channel 611 extends through the side wall inside the two second fluid-collecting tubes 622 and is inserted into an inner second fluid-collecting tube 622. The outer second fluid-collecting tube 622 is configured to provide the second cooling medium to the second micro-channel 611, and the inner second fluid-collecting tube 622 is configured to collect the second cooling medium flowing through the second micro-channel 611. In one embodiment, the inner second fluid-collecting tube 622 is configured to provide the second cooling medium to the second micro-channel 611, and the outer second fluid-collecting tube 622 is configured to collect the second cooling medium flowing through the second micro-channel 611. In this case, the second micro-channel 611 may have a U-shaped flowing path.

2. Heat Exchanger Having Sleeved Tubes

Figure 7:
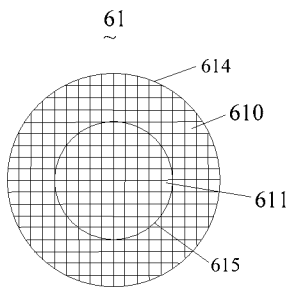
FIG. 7 is a structural schematic view of a heat exchanging body of a heat exchanger shown according to another embodiment of the present disclosure.

As shown in FIG. 7, the heat exchanger 6 includes the heat exchanging body 61. The heat exchanging body includes a first tube body 614 and a second tube body 615, and the first tube body 614 and the second tube body 615 are sleeved within each other. The first tube body 614 defines first micro-channels 610, and the second tube body 615 defines second micro-channels 611. The first micro-channels 610 and the plurality of second micro-channels 611 may be identical to the micro-channels 612 shown in FIG. 2. Therefore, the length of the heat exchanging body 61 may be reduced, and the size of the heat exchanger 6 may be reduced.

The first micro-channels 610 of the first tube body 614 serve as first heat exchanging channels 610 of the heat exchanger 6, and the plurality of second micro-channels 611 of the second tube body 615 serve as second heat exchanging channels 611 of the heat exchanger 6. The extension direction of the first micro-channels 610 may be parallel to the extension direction of the second micro-channels 611. For example, the extension direction of the first micro-channels 610 is the same as the extension direction of the second micro-channels 611

Figure 8:
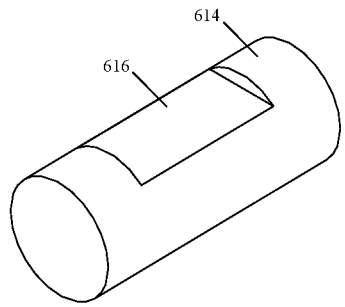
FIG. 8 is a perspective view of a first tube arrangement plane shown in FIG. 7.

In the present embodiment, the first tube body 614 sleeves an outside of the second tube body 615. An outer surface of the first tube body 614 is arranged with at least one flat surface 616 to form a heat exchanging contact surface of the first tube body 614, as shown in FIG. 8. Heat dissipation elements or electronic elements may be arranged on the flat surface 616 for being easily arranged. In some embodiments, the second tube body 615 may sleeve an outer side of the first tube body 614.

In the air conditioning system in FIG. 1, the first cooling medium flows through the plurality of first micro-channels 610, and the second cooling medium flows through the plurality of second micro-channels 611. The first cooling medium may be in the liquid phase, and the second cooling medium may be in the gas-liquid phase. While the second cooling medium is flowing along the plurality of second micro-channels 611, the second cooling medium absorbs heat from the first cooling medium in the plurality of first micro-channels 610 and may be gasified to further sub-cool the first cooling medium. In some embodiments, the first cooling medium and the second cooling medium may be configured in other manners as described in the above.

Compared to the heat exchanger 6 in FIG. 2, in the present embodiment, the area of the cross section of the heat exchanging body 61 is increased, and a pressure loss of the cooling medium may be reduced. In addition, the first tube body 614 sleeves the outside of the second tube body 615, the heat exchanging area of the plurality of first micro-channels 610 and the plurality of second micro-channels 611 may be increased, and the heat exchanging efficiency between the first heat exchanging channel 610 and the second heat exchanging channel 611 may be improved.

As shown in FIG. 4, the heat exchanger 6 may further include the fluid-collecting tube assembly 62. The fluid-collecting tube assembly 62 may include a first fluid-collecting tube 621 and a second fluid-collecting tube 622. The first fluid-collecting tube 621 has a first fluid-collecting channel, and the second fluid-collecting tube 622 has a second fluid-collecting channel. The cross section of the heat exchanger 6 may be I shaped. For example, the heat exchanger 6 has the cross section along the direction that the cooling medium flows in the heat exchanging body 61, and the cross section may be I shaped. In some embodiments, the cross section may be L shaped, U shaped, G shaped, circular, and so on.

The first fluid-collecting channel is communicated with the first micro-channel 610, and the first cooling medium may be provided to the plurality of first micro-channels 610 through the first fluid-collecting channel; and/or the first cooling medium that flows through the plurality of first micro-channels 610 may be collected. Two first fluid-collecting tubes 621 are arranged and are connected to two ends of the first tube body 614, respectively. In this way, the first cooling medium may be provided to the plurality of first micro-channels 610 through one of the two first fluid-collecting tubes 621, and the first cooling medium that flows through the plurality of first micro-channels 610 may be collected through the other one of the two first fluid-collecting tubes 621.

The second fluid-collecting channel is communicated with the second micro-channel 611, and the second cooling medium may be provided to the plurality of second micro-channels 611 through the second fluid-collecting channel; and/or the second cooling medium that flows through the plurality of second micro-channels 611 may be collected. Two second fluid-collecting tubes 622 are arranged and are connected to two ends of the second tube body 615 respectively. In this way, the second cooling medium may be provided to the plurality of second micro-channels 611 through one of the two second fluid-collecting tubes 622, and the second cooling medium that flows through the plurality of second micro-channels 611 may be collected through the other one of the two second fluid-collecting tubes 622.

In some embodiments, the heat exchanging body 61 may include at least two sets of first tube bodies 614 and second tube bodies 615. One of the at least two sets of first tube bodies 614 and second tube bodies 615 may be spaced apart from another one of the at least two sets of first tube bodies 614 and second tube bodies 615 in a direction perpendicular to the extension direction. For example, the at least two sets of first tube bodies 614 and the second tube bodies 615 may include a first set of first tube bodies 614 and the second tube bodies 615 and a second set of first tube bodies 614 and the second tube bodies 615. For the first set, the first tube bodies 614 and the second tube bodies 615 may be sleeved within each other. For the second set, the first tube bodies 614 and the second tube bodies 615 may be sleeved within each other. The first set of first tube bodies 614 and the second tube bodies 615 may be spaced apart from the second set of first tube bodies 614 and the second tube bodies 615, in the direction perpendicular to the extension direction.

For the at least two sets of first tube bodies 614 and second tube bodies 615, same ends of the first tube bodies 614 are connected to one first fluid-collecting tube 621, and same ends of the second tube bodies 615 are connected to one second fluid-collecting tube 622, and costs may be reduced.

The fluid-collecting tubes of the fluid-collecting tube assembly 62 may be configured in any one of the above-described manners. For example, as described in the above, the first fluid-collecting tube 621 is spaced apart from the second fluid-collecting tube 622, the flow divider 624 is arranged inside the master fluid-collecting tube 623, or the first fluid-collecting tube 621 and second fluid-collecting tube 622 are sleeved within each other. In this case, the first tube body 614, the first micro-channel 610 arranged with the first tube body 614, the second tube body 615, and the second micro-channel 611 arranged with second tube body 615 may be engaged with the fluid-collecting tube in the above-mentioned manners, which will not be repeatedly described herein.

Figure 9:
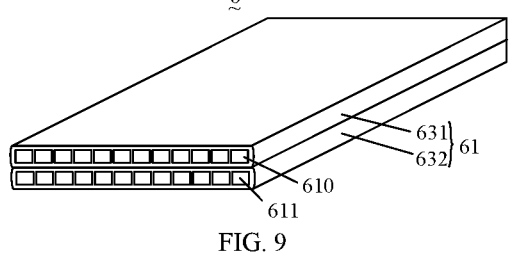
FIG. 9 is a structural schematic view of a heat exchanging body of a heat exchanger shown according to still another embodiment of the present disclosure.

3. Heat Exchanger Having First Plate Body and Second Plate Body that are Laminated with Each Other As shown in FIG. 9, the heat exchanger 6 includes a heat exchanging body 61. The heat exchanging body 61 includes a first plate body 631 and a second plate body 632, the first plate body 631 and the second plate body 632 are laminated with each other.

The first plate body 631 defines first micro-channels 610, and the second plate body 632 defines second micro-channels 611. The first micro-channels 610 and the plurality of second micro-channels 611 may be identical to the micro-channels 612 shown in FIG. 2 and will not be repeated here. Therefore, the length of the heat exchanging body 61 may be reduced, and the size of the heat exchanger 6 may be reduced.

The first micro-channels 610 of the first plate body 631 serve as the first heat exchanging channels 610 of the heat exchanger 6, and the plurality of second micro-channels 611 of the second plate body 632 serve as the second heat exchanging channels 611 of the heat exchanger 6. The extension direction of the first micro-channels 610 is parallel to the extension direction of the second micro-channels 611. For example, the extension direction of the first micro-channels 610 is the same as the extension direction of the second micro-channels 611.

Since the first plate body 631 and the second plate body 632 are laminated with each other, a contact area between the first plate body 631 and the second plate body 632 is increased to increase the heat exchanging area between the first heat exchanging channel 610 and the second heat exchanging channel 611, and the heat exchanging efficiency may be improved.

In the air conditioning system in FIG. 1, the first cooling medium flows through the plurality of first micro-channels 610, and the second cooling medium flows through the plurality of second micro-channels 611. The first cooling medium may be in the liquid phase, and the second cooling medium may be in the gas-liquid phase. While the second cooling medium is flowing along the plurality of second micro-channels 611, the second cooling medium absorbs heat from the first cooling medium in the plurality of first micro-channels 610 and may be gasified to further sub-cool the first cooling medium. In some embodiments, the first cooling medium and the second cooling medium may be configured in other manners as described in the above.

In some embodiments, two first plate bodies 631 may be arranged, and the second plate body 632 may be clamped between the two first plate bodies 631. For example, the first plate body 631, the second plate body 632 and the first plate body 631 are arranged sequentially and are laminated. Since the second plate body 632 is clamped between the two first plate bodies 631, the second cooling medium of the second plate body 632 simultaneously absorbs heat from the first cooling media of the two first plate bodies 631, and the first cooling media of the two first plate bodies 631 may be sub-cooled. In addition, the heat dissipation elements or electronic elements may be arranged to be thermally connected to the first plate body 631. For example, the heat dissipation elements or electronic elements may be arranged on a surface of the first plate body 631 away from the second plate body 632 to facilitate arrangement. In an embodiment, the two first plate bodies 631 may be two separated plates that are independent from each other. In some embodiments, the two first plate bodies 631 may be connected with each other to form an integral one-piece structure, in a U-shape. In this case, the first micro-channels 610 in the two first plate bodies 631 are communicated with each other in the U-shaped structure, and an inlet and an outlet of the first micro-channels 610 are located on a same side of the heat exchanging body 61.

In some embodiments, two second plate bodies 632 may be arranged. The first plate body 631 may be clamped between the two second plate bodies 632. In this case, the heat dissipation elements or the electronic elements may be arranged to be thermally connected to the second plate body 632.

Figure 10:
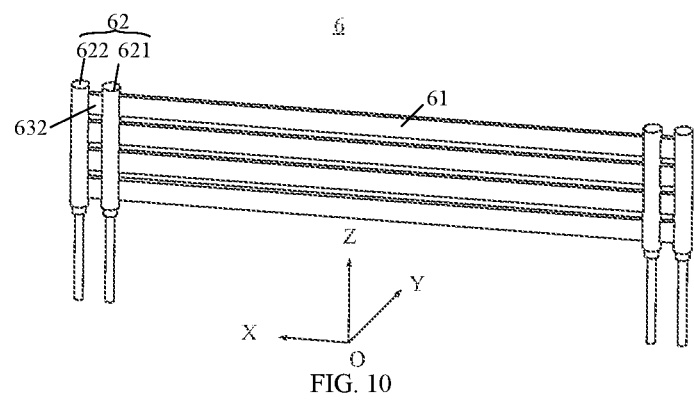
FIG. 10 is a structural schematic view of the heat exchanger shown in FIG. 9.

As shown in FIG. 10, the heat exchanger 6 may further include the fluid-collecting tube assembly 62. The fluid-collecting tube assembly 62 may include a first fluid-collecting tube 621 and a second fluid-collecting tube 622. The first fluid-collecting tube 621 has a first fluid-collecting channel, and the second fluid-collecting tube 622 has a second fluid-collecting channel. The heat exchanger 6 has the cross section along the direction that the cooling medium flows in the heat exchanging body 61, and the cross section may be I shaped. In some embodiments, the cross section may be L shaped, U shaped, G shaped, circular, and so on.

The first fluid-collecting channel is communicated with the first micro-channel 610, and the first cooling medium may be provided to the plurality of first micro-channels 610 through the first fluid-collecting channel; and/or the first cooling medium that flows through the plurality of first micro-channels 610 may be collected. Two first fluid-collecting tubes 621 are arranged and are connected to two ends of the first plate body 631, respectively. In this way, the first cooling medium may be provided to the plurality of first micro-channels 610 through one of the two first fluid-collecting tubes 621, and the first cooling medium that flows through the plurality of first micro-channels 610 may be collected through the other one of the two first fluid-collecting tubes 621.

The second fluid-collecting channel is communicated with the second micro-channel 611, and the second cooling medium may be provided to the plurality of second micro-channels 611 through the second fluid-collecting channel; and/or the second cooling medium that flows through the plurality of second micro-channels 611 may be collected. Two second fluid-collecting tubes 622 are arranged and are connected to two ends of the second plate body 632 respectively. In this way, the second cooling medium may be provided to the plurality of second micro-channels 611 through one of the two second fluid-collecting tubes 622, and the second cooling medium that flows through the plurality of second micro-channels 611 may be collected through the other one of the two second fluid-collecting tubes 622.

In some embodiments, the heat exchanging body 61 may include at least two sets of first plate bodies 631 and second plate bodies 632. One set of the at least two sets of first plate bodies 631 and second plate bodies 632 may be spaced apart from another set of the at least two sets of first plate bodies 631 and second plate bodies 632 in a direction perpendicular to the extension direction. For example, as shown in FIG. 10, the heat exchanging body 61 includes three sets of first plate bodies 631 and the second plate bodies 632. The three sets may be spaced apart from each other along the extension direction of the first micro-channel 610 or along the direction perpendicular to the extension direction of the second micro-channel 611.

For the at least two sets of first plate bodies 631 and second plate bodies 632, same ends of the first plate bodies 631 are connected to one first fluid-collecting tube 621, and same ends of the second plate bodies 632 are connected to one second fluid-collecting tube 622. For example, same ends of all first plate bodies 631 of the heat exchanging body 61 are connected to one first fluid-collecting tube 621, and costs may be reduced.

In the present embodiment, the first fluid-collecting tube 621 is spaced apart from the second fluid-collecting tube 622. The second plate body 632 extends through the first fluid-collecting tube 621 and is inserted into the second fluid-collecting tube 622. The first fluid-collecting tube 621 is disposed between the second fluid-collecting tube 622 and the heat exchanging body 61. The second plate body 632 extends through the first fluid-collecting tube 621 and is inserted into and welded with the second fluid-collecting tube 622. The first plate body 631 is inserted into and welded with the first fluid-collecting tube 621. In some embodiments, the first plate body 631 extends through the second fluid-collecting tube 622 to further connect to the first fluid-collecting tube 621.

A distance between the first fluid-collecting tube 621 and the second fluid-collecting tube 622 is R-2R. The R is a maximum cross-sectional dimension of the first fluid-collecting tube 621 along a spacing direction of the first fluid-collecting tube 621 and the second fluid-collecting tube 622. Each of the cross section of the first fluid-collecting tube 621 and the cross section of the second fluid-collecting tube 622 may be circular. The R may be a diameter of the first fluid-collecting tube 621 or a diameter of the second fluid-collecting tube 622. Further, as described in the above, when the cross section of the first fluid-collecting tube 621 and the cross section of the second fluid-collecting tube 622 are not circular, the R is the diameter of the circumcircle of the first fluid-collecting tube 621 or the diameter of the circumcircle of the second fluid-collecting tube 622.

The fluid-collecting tubes of the fluid-collecting tube assembly 62 may be configured in any one of the above-described manners. For example, as described in the above, the flow divider 624 is arranged inside the master fluid-collecting tube 623, or the first fluid-collecting tube 621 and second fluid-collecting tube 622 are sleeved within each other. In this case, the first plate body 631, the first microchannel 610 arranged with the first plate body 631, the second plate body 633, and the second micro-channel 611 arranged with second plate body 632 may be engaged with the fluid-collecting tube in the above-mentioned manners, which will not be repeatedly described herein.

4. Heat Exchanger Serving as Heat Dissipation Member

In the present disclosure, the heat exchanger 6 described above may serve as a heat dissipation member (hereinafter described as the heat dissipation member 6). The heat dissipation member 6 includes a heat exchanging body 61 and a fluid-collecting tube assembly 62. The heat dissipation member 6 is arranged on an electric control box 7 to dissipate heat from the electric control box 7 and electronic components 71 arranged inside the electric control box 7. To be noted that, the heat dissipation member 6 referred herein shall include the various forms of heat exchangers as described in the above, and shall not be limited to one particular embodiment.

Figure 11:
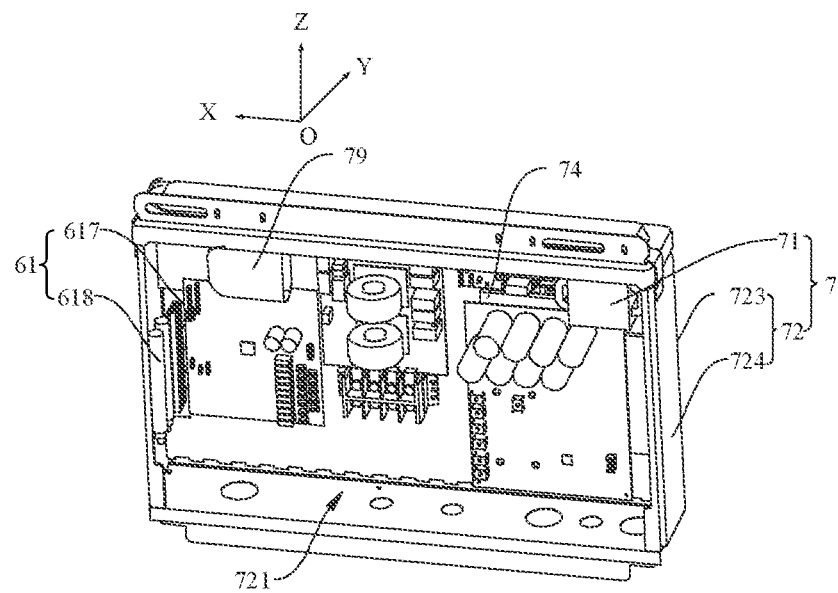
FIG. 11 is a perspective view of an electric control box omitting some components according to an embodiment of the present disclosure.

As shown in FIG. 11, the electric control box 7 may include a box body 72 and the electronic element 71. The box body 72 defines a mounting cavity 721, and the electronic element 71 is received in the mounting cavity 721. The box body 72 is made of metal plate. The electronic element 71 in the mounting cavity 721 may be a compressor, a fan, a capacitor, an electric control and a common mode inductor.

As shown in FIG. 11, the box body 72 includes a top plate (not shown in the drawings, arranged opposite to a bottom plate 723 to cover an opening of the mounting cavity 721), a bottom plate 723, and a circumferential side plate 724. The top plate and the bottom plate 723 are opposite to each other. The circumferential side plate 724 is connected to the top plate and the bottom plate 723, and the mounting cavity 721 is defined.

In detail, as shown in FIG. 11, the bottom plate 723 and the top plate are rectangular.

Four circumferential side plates 724 may be arranged. Each of the four circumferential side plates 724 are connected to a corresponding side of the bottom plate 723 and a corresponding side of the top plate, and the four circumferential side plates 724, the bottom plate 723 and the top plate cooperatively form the rectangular electric control box 7. A length of a long side of the bottom plate 723 is a length of the electric control box 7, and a length of a short side of the bottom plate 723 is a width of the electric control box 7.

A height of the circumferential side plate 724 perpendicular to the bottom plate 723 is a height of the electric control box 7. As shown in FIG. 11, the length of the electric control box 7 in an X direction is the length of the electric control box 7, the length of the electric control box 7 in a Y direction is the height of the electric control box 7, and the length of the electric control box 7 in a Z direction is the width of the electric control box 7.

In some embodiments, a shape of the bottom plate 723 and a shape of the top plate of the box body 72 may be circular, trapezoidal, triangular, and so on. The circumferential side plates 724 are arranged around an outer circumference of the bottom plate 723 to form any shape of the electric control box 7. The shape of the electric control box 7 may be determined based on the demands, and will not be limited by the present disclosure.

Detailed engagement between the heat dissipation member 6 and the electric control box 7 will be described in the following embodiments.

5. Heat Exchanging Body Being L Shaped and U Shaped

Usually, the heat exchanging body 61 is straight, as shown in FIG. 10, the heat exchanging body 61 has an overall length, an overall width, and an overall height. The overall length is the length of the heat exchanging body 61 in the extension direction, i.e., the length of the heat exchanging body 61 along the X direction shown in FIG. 10. The overall width is the length of the heat exchanging body 61 in a direction perpendicular to the extension direction and perpendicular to a plane where the heat exchanging body 61 is disposed, i.e., the length of the heat exchanging body 61 along the Y direction shown in FIG. 10. The overall height is the length of the heat exchanging body 61 in the Z direction shown in FIG. 10.

The plane where the heat exchanging body 61 is disposed refers to a plane and the fluid-collecting tube assembly 62 is disposed, i.e., the plane XOZ shown in FIG. 10.

In order to ensure the heat exchanging effect of the heat dissipation member 6, when a size of the cross section of the heat dissipation member 6 remains unchanged, the extension length of the heat exchanging body 61 needs to be increased to increase the heat exchanging area, and the heat exchanging effect may be improved. When the heat exchanging body 61 is configured as a straight strip, the overall length of the heat exchanging body 61 may be large, a size of the electric control box 7, which is engaged with the heat dissipation member 6, may be large, and the electric control box 7 may not be configured to be miniaturized.

Figure 12:
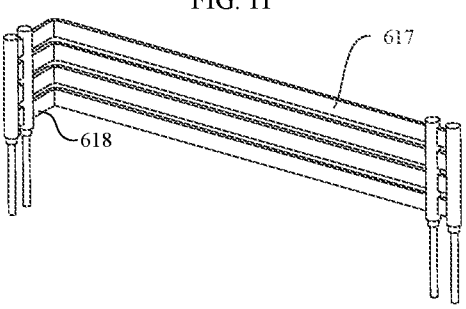
FIG. 12 is a perspective view of the heat exchanger shown in FIG. 11.
Figure 13:
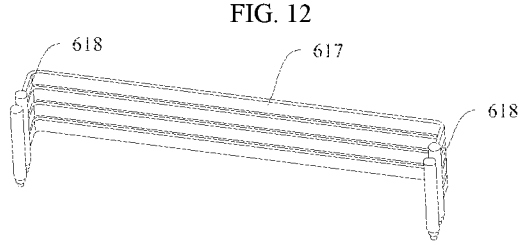
FIG. 13 is a perspective view of the heat exchanger according to another embodiment of the present disclosure.

Therefore, as shown in FIG. 11 and FIG. 12, in order to reduce the overall length of the heat exchanging body 61, the heat exchanging body 61 may be configured as including a first extension portion 617 and a second extension portion 618. The second extension portion 618 is connected to an end of the first extension portion 617 and is bent towards a side of the first extension portion 617.

In the present embodiment, the heat exchanging body 61 is bent, and the first extension portion 617 is connected to and bent towards the second extension portion 618. In this way, the heat exchanging body 61 has a sufficient extension length, but the overall length of the heat exchanging body 61 may be reduced. Therefore, the length of the electric control box 7, which is engaged with the heat dissipation member 6, in the X direction may be reduced, and the size of the electric control box 7 may be reduced.

In the present embodiment, as shown in FIG. 11 and FIG. 12, the heat exchanging body 61 may be arranged on the bottom plate 723 of the electric control box 7.

In detail, the first extension portion 617 may be parallel to the bottom plate 723, and the length of the bottom plate 723 in the length direction may be fully applied to allow the length of the heat exchanging body 61 to be maximized, improving the heat exchanging effect. The second extension portion 618 may be parallel to the circumferential side plate 724 in order to reduce a space occupied by the second extension portion 618 in the X direction.

In some embodiments, the first extension portion 617 may abut against or may be spaced apart from the bottom plate 723. The second extension portion 618 may abut against or may be spaced apart from the circumferential side plate 724. The present disclosure does not limit the relative positions between the extension portions and the plates.

In some embodiments, the heat exchanging body 61 may be arranged on the circumferential side plate 724 of the electric control box 7. In detail, the first extension portion 617 may be parallel to one of the four circumferential side plates 724, and the second extension portion 618 may be parallel to another one of the four circumferential side plates 724, and the another one of the four circumferential side plates 724 may be adjacent to the one circumferential side plate 724 parallel to the first extension portion 617. In this way, the heat dissipation member 6 may be arranged on one side of the mounting cavity 721.

In some embodiments, the heat exchanging body 61 may be fixed at other positions of the electric control box 7 based on the arrangement of the electronic elements 71, and so on. The present disclosure does not limit a position where the heat exchanging body 61 shall be arranged.

Further, as shown in FIG. 12, more than one second extension portions 618 may be arranged. One of the more than one second extension portions 618 may be connected to one of two ends of the first extension portion 617, and the heat exchanging body 61 may be L-shaped.

As shown in FIG. 12, two second extension portions 618 may be arranged. The two second extension portions 618 may be connected to two ends of the first extension portion 617, respectively, and may be bent towards a same side of the first extension portion 617.

In detail, the two second extension portions 618 may be parallel to each other and may be spaced apart from each other, and the two second extension portions 618 may be arranged at opposite ends of the first extension portion 617, and the overall length of the heat exchanging body 61 may be reduced but the heat exchanging effect of the heat exchanging body 61 may be maintained, and a size of the heat dissipation member 6 may be reduced. In addition, by contrast to arranging the two second extension portion 618 on opposite sides of the first extension portion 617, in the present embodiment, the two second extension portions 618 may be bent and arranged on a same side of the first extension portion 617, and the overall width of the heat dissipation member 6 may be reduced.

Further, the two second extension portions 618 may be perpendicular to the first extension portion 617 to form a U-shaped heat exchanging body 61. In this way, the overall length of the heat exchanging body 61 may be reduced, and a space occupied by the second extension portions 618 in the X direction may be reduced, and the two second extension portions 618 may not interfere with the electronic elements 71 arranged inside the mounting cavity 721.

In some embodiments, the two second extension portions 618 may be inclined relative to the first extension portion 617, an angle that one of the two second extension portions 618 is inclined relative to the first extension portion 617 may be different from another angle that the other one of the two second extension portions 618 is inclined relative to the first extension portion 617. In this way, the overall width of the electric control box 7 may be reduced.

Further, an extension length of the first extension portion 617 may be greater than an extension length of the second extension 618, and the first extension portion 617 may be arranged along the length of the electric control box 7, and the second extension portion 618 may be arranged along the width or the height of the electric control box 7.

Further, as shown in FIG. 11, one heat dissipation member 6 may be received in the mounting cavity 721. The one heat dissipation member 6 may be received in the mounting cavity 721 extending along the length of the box body 72. In some embodiments, the one heat dissipation member 6 may be received in the mounting cavity 721 extending along the height of the box body 72.

In some embodiments, at least two heat dissipation members 6 may be received in the mounting cavity 721. For example, the number of heat dissipation members 6 may be two, three, four, five, and so on. By arranging a larger number of heat dissipation members 6, the heat dissipation effect of the electric control box 7 may be improved.

In detail, two heat dissipation members 6 may be received in the mounting cavity 721. Two heat exchanging bodies 61 of the two heat dissipation members 6 may be L-shaped. The two heat dissipation members 6 may be spaced apart from each other along the length direction (X direction) of the electric control box 7. That is, the first extension portion 617 of one of the two heat dissipation members 6 may be spaced apart from the first extension portion 617 of the other one of the two heat dissipation members 6, along the length direction (X direction) of the electric control box 7. For one of the two heat dissipation members 6, the second extension portions 618 may be disposed on a side of the first extension portion 617 away from the first extension portion 617 of the other one of the two heat dissipation members 6. In this way, the two heat dissipation members 6 may not interfere with the electronic elements 71 received in the mounting cavity 721.

In some embodiments, the two heat dissipation members 6 may be arranged side by side and spaced apart from each other along the width direction (Z direction) of the electric control box 7. That is, the first extension portion 617 of each of the two heat dissipation members 6 extends along the length direction (X direction) of the electric control box 7, and the first extension portion 617 of one of the two heat dissipation members 6 and the first extension portion 617 of the other one of the two heat dissipation members 6 may be arranged side by side and may be spaced apart from each other. For each of the two heat dissipation members 6, the second extension portions 618 may be disposed on a same side or on different sides of the corresponding first extension portion 617.

5.1 Fixing Bracket

In the art, since the economizer arranged inside the electric control box 7 may be large in size and may have an irregular shape, a fixing structure of the economizer may be complicated and may not be assembled efficiently. In the present disclosure, the heat dissipation member 6 may be plate shaped, and the heat dissipation member 6 may be assembled and fixed easily, improving the assembling efficiency.

Figure 14:
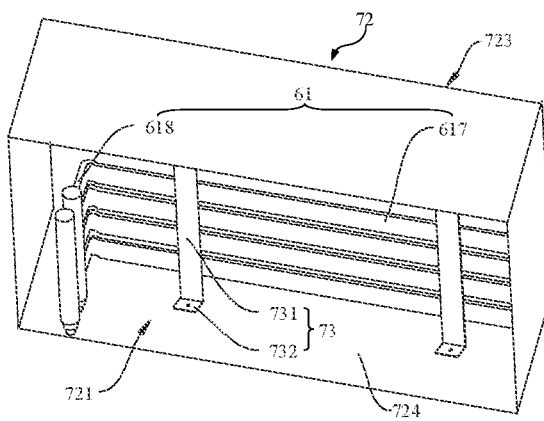
FIG. 14 is a perspective view of a fixing bracket engaged with the heat dissipation member according to an embodiment of the present disclosure.

In the present embodiment, as shown in FIG. 14, the electric control box 7 may include a fixing bracket 73, and the fixing bracket 73 may be connected between the heat exchanging body 61 and the box body 72 to enable the heat exchanging body 61 to be fixedly arranged inside the electric control box 7.

In the present embodiments, the fixing bracket 73 may be connected between the first extension portion 617 and the circumferential side plate 724. In one embodiment, the fixing bracket 73 may be connected between the second extension portion 618 and the circumferential side plate 724. Connection structures of the above two arrangements may substantially be the same. In the following, the fixing bracket 73 being connected between the first extension portion 617 and the circumferential side plate 724 may be taken as an example to illustrate the connection structure of the heat exchanging body 61 and the box body 72.

As shown in FIG. 14, the fixing bracket 73 may include a first fixing portion 731 and a second fixing p portion art 732. The first fixing portion 731 may bend towards the second fixing p portion art 732. The first fixing portion 731 may be welded to the first extension portion 617, and the second fixing portion 732 may be fastened to the circumferential side plate 724.

In detail, the first fixing portion 731 may be welded to one of main surfaces of the heat exchanging body 61 to increase a welding area between the fixing bracket 73 and the heat exchanging body 61, improving a welding strength. By welding the first fixing portion 731 to the first extension portion 617, the first extension portion 617 may not need to define any hole, and the micro-channels defined in the heat exchanging body 61 may not be interrupted. The second fixing portion 732 may be connected to the circumferential side plate 724 by screws, snaps or glue, and the heat dissipation member 6 may be maintained or replaced easily.

The main surface of the heat exchanging body 61 refers to a surface of the heat exchanging body 61 having a large area. In this embodiment, as shown in FIG. 10, the main surface of the heat exchanging body 61 refers to a surface parallel to the XOZ plane.

In some embodiments, as shown in FIG. 14, the second fixing portion 732 is connected vertically to the first fixing portion 731, and an L-shaped fixing bracket 73 may be formed. By connecting the first fixing portion 731 vertically to the second fixing portion 732, forces applied to the fixing bracket 73 may be evenly distributed on the fixing bracket 73.

Figure 15:
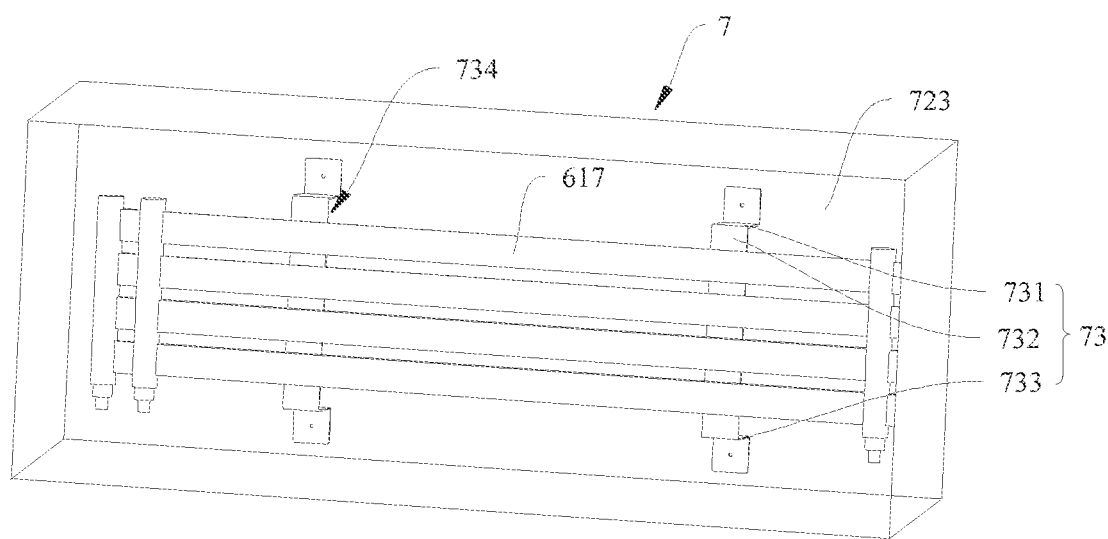
FIG. 15 is a perspective view of a fixing bracket engaged with the heat dissipation member according to another embodiment of the present disclosure.

In one embodiment, as shown in FIG. 15, the fixing bracket 73 may include a first fixed portion 731, a second fixed portion 732 and a third fixed portion 733. The first fixed portion 731, a second fixed portion 732 and a third fixed portion 733 may be connected with each other, and a connection part between any two of the portions may be bent. The first fixed portion 731 and the third fixed portion 733 may be spaced apart from each other and connected to the bottom plate 723. The second fixed portion 732 and the bottom plate 723 may be spaced apart from each other to cooperatively define a clamping slot 734. The first extension portion 617 may be welded to a side of the second fixed portion 732 away from the clamping slot 734. In this case, the heat exchanging body 61 may be spaced apart from the bottom plate 723, and the contact between the heat exchanging body 61 and the electric control box 7 may be interrupted, heat exchanging between the heat exchanging body 61 and the electric control box 7 may be avoided, and the heat dissipation efficiency of the heat dissipation member 6 may not be reduced.

In detail, the first fixed portion 731 and the third fixed portion 733 may be bent towards and connected to opposite ends of the second fixed portion 732 and may be disposed on a same side of the second fixed portion 732, and a clamping slot 734 in a C shape may be defined. An end of the first fixed portion 731 away from the second fixed portion 732 and an end of the third fixed portion 733 away from the second fixed portion 732 may be connected to the bottom plate 723. The connection manner between the second fixing portion 732 and the heat exchanging body 61 may be the same as and may be referred to the embodiments described in the above. The connection manner that the first fixing portion 731 and the third fixing portion 733 are connected to the bottom plate 723 may be the same as and may be referred to the embodiments described in the above. The connection manners will not be repeated herein.

In some embodiments, the first extension portion 617 may be clamped in the clamping slot 734. The first extension portion 617 may abut against the bottom plate 723 and the second fixing portion 732 on two opposite sides along the overall width direction of the heat exchanging body 61. The first extension portion 617 may abut against the first fixing portion 731 and the third fixing portion 733 on two opposite sides along the overall height direction of the heat exchanging body 61. In this way, the first extension portion 617 may be fixed. The heat exchanging body 61 may be fixed by being clamped, and the heat exchanging body 61 may not be damaged, and the heat exchanging body 61 may be easily repaired or replaced.

The above-mentioned fixing brackets may be applied to fix the heat dissipation members in any forms as disclosed herein, and a position and the heat dissipation member is fixed may not be limited herein.

5.2 Heat Dissipation Member Arranged Inside Electric Control Box

Further as shown in FIG. 11, the heat dissipation member 6 is received in the mounting cavity 721 of the electric control box 7. In detail, the heat dissipation member 6 may be thermal-conductively connected to the electronic element 71 received in the mounting cavity 721 to dissipate heat from the electronic element 71.

In detail, as described in the embodiments of FIG. 11, the electronic element 71 may be thermal-conductively connected to the first extension portion 617 and/or the second extension portion 618. The heat dissipation members in any forms as disclosed herein may be received inside the mounting cavity 721 of the electric control box 7 or applied to dissipate heat from the electric control box 7, and may be directly or indirectly thermal-conductively connected to the electronic element 71.

When the heat dissipation member 6 is received in the mounting cavity 721, in the embodiment shown in FIG. 11, the electronic element 71 may be thermal-conductively connected to the first extension portion 617. The electronic element 71 and the second extension portion 618 may be arranged on a same side of the first extension portion 617, and the height of the electric control box 7, i.e., a size along the Y direction, may be reduced, In some embodiments, the electronic element 71 may be thermal-conductively connected to the second extension portion 618, and may be arranged on a side of the second extension portion 618 facing towards the first extension portion 617, and the length of the electric control box 7, i.e., a size along the X direction, may be reduced.

In some embodiments, a part of the electronic element 71 may be arranged on the first extension portion 617, and another part of the electronic element 71 may be arranged on the second extension portion 618, and the electronic element 71 may be evenly distributed.

Since the number of electronic elements 71 may be large, connecting each of the large number of the electronic elements 71 to the heat exchanging body 61 may cause the electronic elements 71 to be mounted in a complicated manner, and the mounting efficiency may be low.

Figure 16:
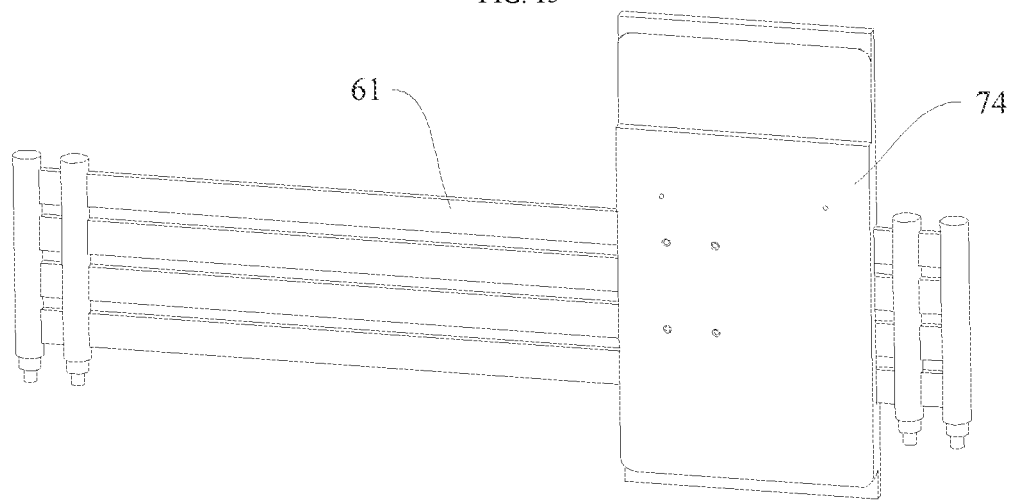
FIG. 16 is a perspective view of a heat dissipation fixing plate engaged with the heat dissipation member according to an embodiment of the present disclosure.

Therefore, as shown in FIG. 11 and FIG. 16, a heat dissipation fixing plate 74 may be arranged inside the electric control box 7. The electronic elements 71 may be arranged on the heat dissipation fixing plate 74. Further, the heat dissipation fixing plate 74 may be arranged on the heat exchanging body 61, and the electronic elements 71 may be thermal-conductively connected to the heat exchanging body 61 through the heat dissipation fixing plate 74. In this way, the efficiency of mounting the electronic elements 71 may be greatly improved.

In detail, the heat dissipation fixing plate 74 may be arranged on the first extension portion 617 and/or the second extension portion 618, and the electronic elements 71 may be arranged on a side of the heat dissipation fixing plate 74 away from the first extension portion 617 and/or the second extension portion 618.

Further, the heat dissipation fixing plate 74 may be arranged on the main surface of the heat exchanging body 61 to increase the contact area between the heat dissipation fixing plate 74 and the heat exchanging body 61, and the heat exchanging efficiency may be improved. In one embodiment, the main surface of the heat exchanging body 61 may provide a larger support surface for the heat dissipation fixing plate 74, and therefore, the electronic elements 71 may be arranged more stably.

The heat dissipation fixing plate 74 may be made of metal or alloy having better thermal conductivity. For example, the heat dissipation fixing plate 74 may be made of aluminum, copper, aluminum alloy, and so on, to enhance the efficiency of heat conductivity.

Figure 17:
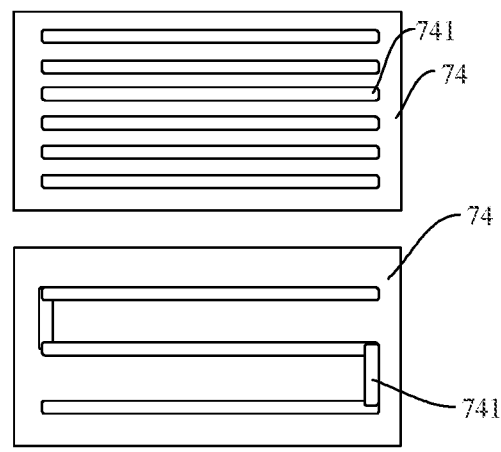
FIG. 17 is a planar view of a heat dissipation fixing plate according to an embodiment of the present disclosure.

In some embodiments, as shown in FIG. 17, the heat pipe 741 may be embedded in the heat dissipation fixing plate 74. The heat pipe 741 may be configured to rapidly conduct heat from a concentrated high-density heat source to the entire surface of the heat dissipation fixing plate 74, and the heat may be evenly distributed on the heat dissipation fixing plate 74, and the heat exchanging effect between the heat dissipation fixing plate 74 and the heat exchanging body 61 may be enhanced.

As shown in the upper portion of FIG. 17, the heat pipe 741 may be long-strip shaped. Heat pipes 741 may be arranged. The heat pipes 741 may be arranged in parallel and spaced apart from each other. In one embodiment, as shown in the lower portion of FIG. 17, the plurality of heat pipes 741 may be connected successively to each other to form a square or a frame, which will not be limited by the present application.

5.3 Heat Dissipation Member Arranged Out of Electric Control Box

Figure 18:
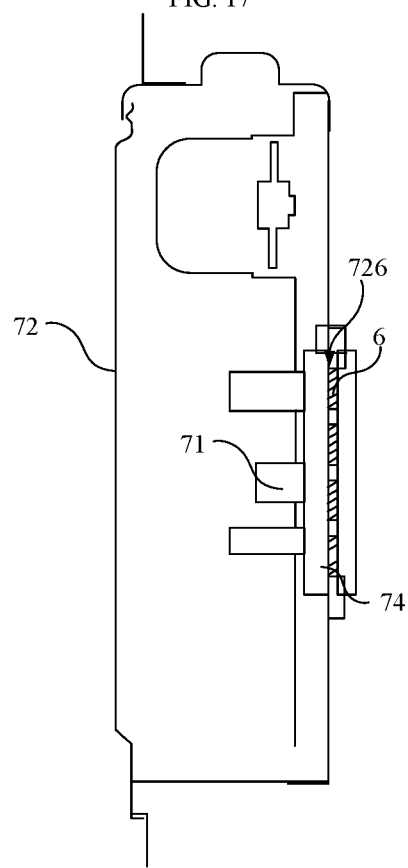
FIG. 18 is a cross sectional view of a heat dissipation member engaged with an electric control box according to an embodiment of the present disclosure.

As shown in FIG. 18, the heat dissipation member 6 may be arranged on an outside of the electric control box 7. The box body 72 of the electric control box 7 may define an assembly port 726, and the electronic elements 71 may be thermal-conductively connected to the heat dissipation member 6 through the assembly port 726.

In detail, as shown in FIG. 18, the heat dissipation fixing plate 74 may be connected to the heat dissipation member 6 and cover the assembly port 726. The electronic elements 71 may be arranged on a surface of the heat dissipation fixing plate 74 away from the heat dissipation member 6.

Figure 19:
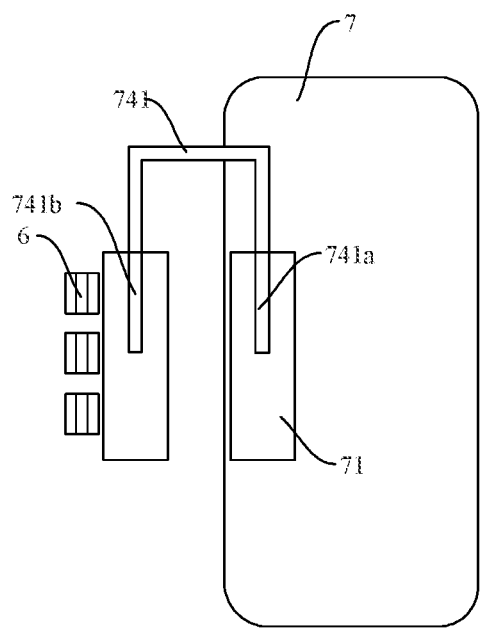
FIG. 19 is a cross sectional view of a heat dissipation member engaged with an electric control box according to another embodiment of the present disclosure.

In some embodiments, as shown in FIG. 19, the heat pipe 741 may be arranged to enable the electronic elements 71 to be thermal-conductively connected to the heat dissipation member 6. For example, the heat pipe 741 may include a heat absorbing end 741a and a heat releasing end 741b. The heat absorbing end 741a of the heat pipe 741 may be inserted inside the mounting cavity 721 and thermal-conductively connected to the electronic elements 71 to absorb heat from the electronic elements 71. The heat releasing end 741b of the heat pipe 741 may be arranged on the outside of the electric control box 7 and thermal-conductively connected to the heat dissipation member 6, taking the heat dissipation member 6 to dissipate heat from the heat releasing end 741b of the heat pipe 741.

5.4 Heat Dissipation Fin

A large amount of heat may be generated while the electronic elements 71 are operating, and the electric control box 7 may be relatively sealed. When the heat in the electric control box 7 cannot be released in time, a temperature in the mounting cavity 721 of the electric control box 7 may be high. Therefore, the electronic elements 71 may be damaged. Although the cooling medium flowing in the heat dissipation member 6 arranged inside the mounting cavity 721 may take away some of the heat, the heat dissipation performance of the electric control box 7 may still be poor.

Figure 20:
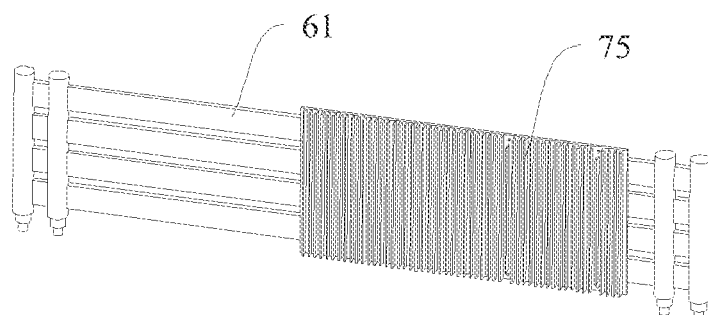
FIG. 20 is a perspective view of a heat dissipation fin engaged with the heat dissipation member according to an embodiment of the present disclosure.

Therefore, as shown in FIG. 11 and FIG. 20, a heat dissipation fin 75 may be arranged inside the electric control box 7. The heat dissipation fin 75 may be thermal-conductively connected to the heat exchanging body 61, and the contact area between the heat exchanging body 61 and the air in the electric control box 7 may be increased due to the heat dissipation fin 75, heat exchanging with the air may be improved, the temperature in the mounting cavity 721 may be reduced, and the electric elements 71 may be protected.

In some embodiments, one of the electronic element 71 and the heat dissipation fin 75 may be arranged on the first extension portion 617, and the other one of the electronic element 71 and the heat dissipation fin 75 may be arranged on the second extension portion 618, and the electronic element 71 may be misaligned with the heat dissipation fin 75, and the electronic element 71 may not be interfered by the heat dissipation fin 75. Further, the distance between the electronic element 71 and the heat dissipation fin 75 may be large, and the temperature of the cooling medium that contacts the heat dissipation fin 75 and the electronic element 71 may be low, and the heat dissipation effect of the heat exchanging body 61 may be improved.

Further, as shown in FIG. 20, one heat dissipation fin 75 may be arranged. A size of the heat dissipation fin 75 in the overall height direction of the heat exchanging body 61 may be greater than the overall height of the heat exchanging body 61. The heat dissipation fin 75 may be connected to the surface of the heat exchanging body 61 by welding, bonding or fastening. A smaller number of heat dissipation fins 75 may be arranged, and the arranged heat dissipation fin 75 may have a large surface area. On one hand, the heat dissipation fin 75 may be easily connected to the heat exchanging body 61, improving the efficiency of arranging the heat dissipation fin 75 and the heat exchanging body 61. On another hand, the contact area between the heat dissipation fin 75 and the air may be increased, improving the heat exchanging effect.

Figure 21:
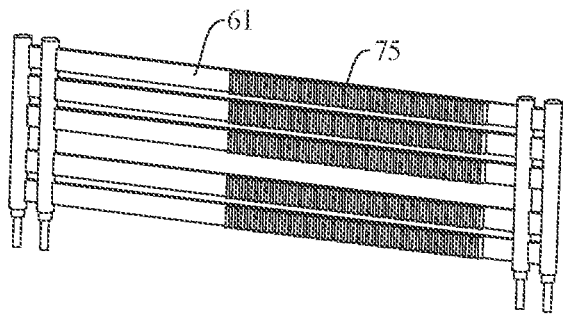
FIG. 21 is a perspective view of a heat dissipation fin engaged with the heat dissipation member according to another embodiment of the present disclosure.

As shown in FIG. 21, heat dissipation fins 75 may be arranged. A size of each of the plurality of heat dissipation fins 75 along the overall height direction of the heat exchanging body 61 may be equal to a size of each plate body along the overall height direction of the heat exchanging body 61. Each of the plurality of heat dissipation fins 75 may be attached to one plate body. The heat dissipation fins 75 may be spaced apart from each other and arranged along the overall height direction of the heat exchanging body 61, and the contact area of the heat dissipation fins 75 and the air may be increased. Since the plurality of heat dissipation fins 75 are arranged and are spaced apart from each other, the heat exchanging efficiency of the heat dissipation fins 75 may be ensured, manufacturing materials may be saved, and production costs may be reduced.

In some embodiments, the heat dissipation fin 75 may be extended to the outside of the electric control box. For example, the assembly port may be defined in the box body 72, the heat exchanging body 61 may be arranged inside the box body 72 and thermal-conductively connected to the electronic elements 71. A side of the heat dissipation fin 75 may be thermal-conductively connected to the heat exchanging body 61 and extends to the outside of the box body 72 through the assembly port, and air cooling may be applied to improve the heat dissipation effect of the heat exchanging body 61.

Heat dissipation fin may be applicable to the heat exchangers in any forms as described herein, and shall not be limited to a particular embodiment.

Figure 22:
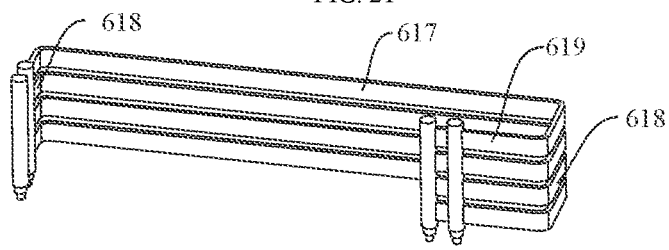
FIG. 22 is a perspective view of a heat dissipation member according to another embodiment of the present disclosure.

6. G-Shaped Heat Exchanging Body and Engagement Between Exchanging Body and Electronic Elements As shown in FIG. 22, in the present embodiment, the structure of the heat dissipation member 6 is substantially the same as that of the heat dissipation member 6 in the above embodiments. Further, in the present embodiment, the heat dissipation member 6 further includes a third extension portion 619. The first extension portion 617 and the third extension portion 619 are arranged side by side and are spaced apart from each other. The second extension portion 618 is connected between an end of the first extension portion 617 and an end of the third extension portion 619 adjacent to the end of the first extension portion 617.

In detail, the third extension portion 619 is connected to an end of the second extension portion 618 away from the first extension portion 617 and is bent towards a side of the second extension portion 618 facing towards the first extension portion 617, and the third extension portion 619 may be spaced apart from the first extension portion 617. In this way, while the extended length of the heat exchanging body 61 remains unchanged, the overall length and the overall width of the heat exchanging body 61 may be reduced to further reduce the size of the electric control box 7 that is engaged with the heat dissipation member 6.

In some embodiments, as shown in FIG. 22, two second extension portions 618 are arranged. The two second extension portions 618 are bent towards and connected to two opposite ends of the first extension portion 617. One third extension portion 619 is arranged. The third extension portion 619 is arranged at an end of one of the two second extension portions 618 away from the first extension portion 617 and is towards the other one of the two second extension portions 618, and a G-shaped heat exchanging body 61 is formed.

In some embodiments, two second extension portions 618 are arranged. One of the two second extension portions 618 is bent towards and connected to one of two ends of the first extension portion 617. One third extension portion 619 is arranged. The third extension portion 619 is arranged at an end of the second extension portion 618 away from the first extension portion 617 and is bent towards the first extension portion 617.

In some embodiments, two second extension portions 618 are arranged. The two second extension portions 618 are bent towards and connected to two opposite ends of the first extension portion 617. Two third extension portions 619 are arranged. The two third extension portions 619 are connected to ends of the two second extension portions 618 away from the first extension portion 617 and are extending towards each other, and the overall length of the heat exchanging body 61 may further be reduced.

Further, the third extension portion 619 may be spaced apart from and parallel to the first extension portion 617, to avoid the third extension portion 619 from increasing the overall width of the heat exchanging body 61. Further, the electronic components 71 may be disposed between the third extension portion 619 and the first extension portion 617, the internal space of the electric control box 7 may be optimally utilized.

In detail, the electronic elements 71 may be arranged on and thermal-conductively connected to the first extension portion 617. Further, the electronic elements 71 may be disposed between the first extension portion 617 and the third extension portion 619. In one embodiment, the electronic elements 71 may be arranged on and thermal-conductively connected to the third extension portion 619. Further, the electronic elements 71 may be disposed between the first extension portion 617 and the third extension portion 619.

Since the electronic elements 71 are disposed between the first extension portion 617 and the third extension portion 619, the space between the first extension portion 617 and the third extension portion 619 may be optimally utilized, the structure of the electronic elements 71 and the heat exchanging body 61 may be configured to be more compact. In one embodiment, the electronic elements 71 may be arranged on both the first extension portion 617 and the third extension portion 619, and the electronic elements 71 may be thermal-conductively connected to both the first extension portion 617 and the third extension portion 619. In this way, the heat exchange between the heat dissipation member 6 and the electronic elements 71 may further be improved, improving the efficiency of dissipating heat from the electronic elements 71.

Further, there are various types of electronic elements 71. The electronic elements 71 may be classified as elements that are prone to have failures and elements that are not prone to have failures, based on frequencies that the elements have failures while being used. Since the space between the first extension portion 617 and the third extension portion 619 is limited, the electronic elements 71 may not be easily disassembled. Therefore, in the present embodiment, the electronic elements 71 that are not prone to have failure may be disposed between the first extension portion 617 and the third extension portion 619, reduce the chances of repairing the electronic elements 71.

Further, the heat dissipation fixing plate 74 may be fixed to the third extension portion 619 in addition to the first extension portion 617 and/or the second extension portion 618 in the manner as described in the above embodiments.

In detail, the heat dissipation fixing plate 74 may be arranged on a side of the third extension portion 619 facing towards the first extension portion 617, and the electronic elements 71 may be arranged on a side of the heat dissipation fixing plate 74 facing towards the first extension portion 617. In this way, the structure of the electronic elements 71 and the heat exchanging body 61 may be more compact, the internal space of the electric control box 7 may not be excessively occupied.

Similarly, in the present embodiment, the heat dissipation fin 75 may be fixed to the third extension portion 619 in addition to the first extension portion 617 and/or the second extension portion 618 in the manner as described in the above embodiments.

In detail, one of the heat dissipation fin 75 and the electronic elements 71 may be arranged on the first extension portion 617, and the other one of the heat dissipation fin 75 and the electronic elements 71 may be arranged on the second extension portion 618 and/or the third extension portion 619, and the heat dissipation fin 75 may be misaligned with the electronic elements 71.

In some embodiments, one heat dissipation fin 75 may be arranged. The heat dissipation fin 75 may be arranged on the second extension portion 618 or the third extension portion 619. In one embodiment, two heat dissipation fins 75 may be arranged. The two heat dissipation fins 75 may be arranged on the second extension portion 618 and the third extension portion 619 respectively. In this way, the contact area between the heat dissipation fins 75 and the air may be increased, improving the heat dissipation effect of the heat dissipation member 6.

Figure 23:
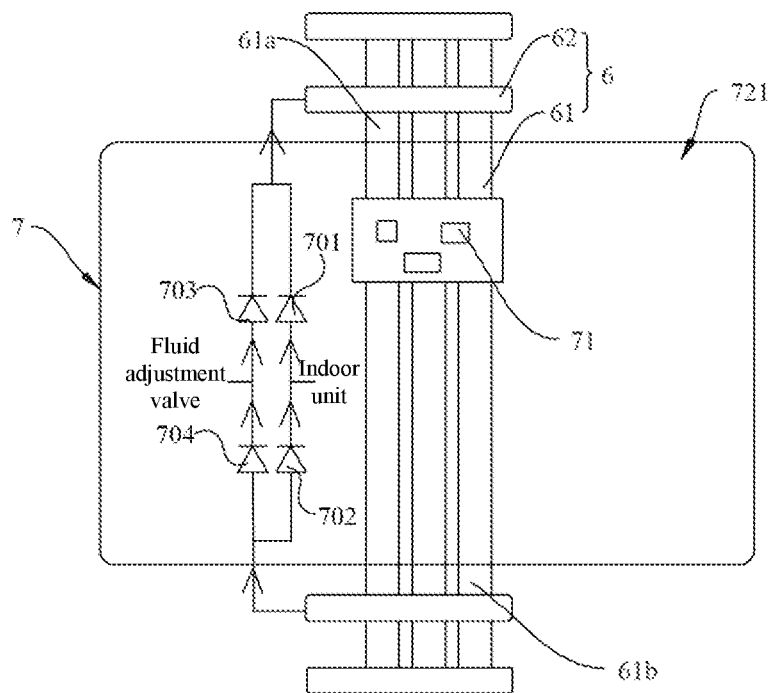
FIG. 23 is a planar view of a heat dissipation member engaged with the electric control box according to another embodiment of the present disclosure.

7. Heat Dissipation Plate Arranged at Position of Heat Dissipation Member Having High Temperature As shown in FIG. 23, in the present embodiment, the electric control box 7 may include a box body 72, a heat dissipation member 6 and an electronic element 71. The box body 72 defines a mounting cavity 721. At a part of the heat dissipation member 6 is received in the mounting cavity 721, and the electronic element 71 is received in the mounting cavity 721. The structure of the box body 72 and the heat dissipation member 6 is substantially the same as the above-mentioned embodiments, and may be referred to the description of the above-mentioned embodiments.

In some embodiments, the heat exchanging body 61 may be entirely received inside the mounting cavity 721 of the electric control box 7. In one embodiment, a part of the heat exchanging body 61 may be received inside the mounting cavity 721 of the electric control box 7, and another part of the heat exchanging body 61 may be protruding out of the electric control box 7 to connect to an external tube of the fluid-collecting tube assembly 62.

Flowing of the cooling medium may allow a temperature of the heat dissipation member 6 to be low. The electronic elements 71 in the electric control box 7 may generate heat to increase the temperature of the mounting cavity 721 of the electric control box 7. When the high temperature air in the electric control box 7 contacts the heat dissipation member 6, condensation may occur, and water may be generated on a surface of the heat dissipation member 6. When the generated condensed water flows to the positions of the electronic elements 71 are arranged, the electronic elements 71 may be short-circuited or damaged, or more seriously, fire may be caused.

Therefore, as shown in FIG. 23, the heat exchanging body 61 may include a first end 61*a* and a second end 61*b* along a flowing direction of the cooling medium. A temperature of the heat exchanging body 61 is gradually reduced in a direction from the first end 61*a* to the second end 61*b*. That is, a temperature of the first end 61*a* is higher than a temperature of the second end 61*b*. The electronic elements 71 are arranged at positions near the first end 61*a* and are thermal-conductively connected to the heat exchanging body 61. To be noted that, since the heat exchanging body 61 needs to exchange heat with the internal environment of the electric control box 7 or with the elements inside the electric control box 7, the temperature of the heat exchanging body 61 as described in the above and in the following refers to a temperature of the surface of the heat exchanging body 61. In detail, a change in the temperature of the surface of the heat exchanging body 61 is determined by the heat exchanging channels adjacent to the surface. For example, when the heat exchanging channel adjacent to the surface of the heat exchanging body 61 is the primary channel, heat of the cooling medium in the primary channel is continuously absorbed by the cooling medium in the secondary channel as the cooling media are flowing, the temperature of the surface of the heat exchanging body 61 gradually decreases along the flowing direction of the cooling medium in the primary channel. In this case, the first end 61*a* is located at an upstream of the second end 61*b* along the flowing direction of the cooling medium in the primary channel. When the surface of the heat exchanging body 61 is adjacent to the secondary channel, the temperature of the surface of the heat exchanging body 61 gradually increases along the flowing direction of the cooling medium in the secondary channel. In this case, the first end 61*a* is located at a downstream of the second end 61*b* along the flowing direction of the cooling medium in the secondary channel.

Therefore, the heat exchanging body 61 may be divided into the first end 61*a* having the higher temperature and the second end 61*b* having the lower temperature based on the change in temperature of the heat exchanging body 61. Since a temperature difference between the first end 61*a* having the higher temperature and the hot air may be small, no condensed water or a less volume of condensed water may be generated. The electronic elements 71 may be arranged at positions near the first end 61*a*, and therefore, chances that the electronic elements 71 contact the condensed water may be reduced, and the electronic elements 71 may be protected.

To be noted that, since the air conditioner usually has the refrigerating mode and the heating mode, and in these two modes, the cooling media may flow in opposite directions. In this case, temperature changing trends from the first end 61*a* of the heat exchanging body 61 to the second end 61*b* of the heat exchanging body 61 may be opposite. That is, in one mode, the temperature of the heat exchanging body 61 gradually decreases from the first end 61*a* to the second end 61*b*, and in the other mode, the temperature of the heat exchanging body 61 gradually increases from the first end 61*a* to the second end 61*b*. In the present embodiment, the priority is given to the refrigerating mode, ensuing the temperature of the heat exchanging body 61 gradually decreases from the first end 61*a* to the second end 61*b*. Reasons will be explained in the following.

When an ambient temperature is low, for example, when the air conditioning apparatus is operating to heating the environment in winter, the temperature of the air inside the electric control box 7 is low. In this case, the temperature difference between the air inside the electric control box 7 and the heat dissipation member 6 is small, and the air may not be easily condensed to form condensed water. When the ambient temperature is high, for example, when the air conditioning apparatus is operating to cool the environment in summer, the temperature of the air in the electric control box 7 is high, and the temperature difference between the air in the electric control box 7 and the heat dissipation member 6 is high. The air may be easily condensed to form the condensed water. Therefore, in the present embodiment, at least in the refrigerating mode, the temperature of the heat exchanging body 61 gradually decreases in the direction from the first end 61*a* to the second end 61*b*, and the condensed water may not be generated on the heat exchanging body 61 while the apparatus is operating in the refrigerating mode.

Further, arranging the electronic element 71 at a position near the first end 61a means that a position where the electronic element 71 is thermal-conductively connected to the heat exchanging body 61 may be in a first distance away from the first end 61a and may be in a second distance away from the second end 61b. The first distance is less than the second distance.

In detail, since the temperature of the heat exchanging body 61 gradually decreases in the direction from the first end 61a to the second end 61b, the first end 61a has a highest temperature, and the second end 61b has a lowest temperature. The higher the temperature of the heat exchanging body 61, the smaller the temperature difference between the heat exchanging body 61 and the air inside the electric control box 7, and the condensed water is less likely to be generated. The lower the temperature of the heat exchanging body 61, the greater the temperature difference between the heat exchanging body 61 and the hot air, and the condensed water is more likely to be generated. In other words, the chance of generating the condensed water gradually increases in the direction from the first end 61a to the second end 61b of the heat exchanging body 61. Therefore, the electronic element 71 is arranged near the higher temperature end of the heat exchanging body 61, i.e., at a position where the condensed water is less likely to be generated, and a risk of the electronic element 71 contacting the condensed water may be reduced, and the electronic element 71 may be protected.

Further as shown in FIG. 23, the extension direction of the heat exchanging body 61 may be arranged to be the vertical direction, and the first end 61a may be arranged at an upper of the second end 61b. In this way, when the condensed water is generated at the position of the heat exchanging body 61 near the second end 61b, the condensed water may flow down in the vertical direction. That is, the condensed water may flow in a direction away from the electronic element 71 to avoid the electronic element 71 from contacting the condensed water.

In some embodiments, the extension direction of the heat exchanging body 61 may be arranged to be the horizontal direction based on demands, and the condensed water that is generated near the second end 61b position may be quickly separated from the heat exchanging body 61 due to the gravitational force, preventing the electronic element 71 from contacting the condensed water. In some embodiments, the extension direction of the heat exchanging body 61 may be arranged to be inclined at an angle with respect to the horizontal direction, which will not be limited by the present disclosure.

It shall be understood that, in the present embodiment, the structure of the heat dissipation member 6 may be the same as that in the above-mentioned embodiments, i.e., a bent heat exchanging body 61 may be configured. In the present embodiment, the structure of the heat dissipation member 6 may be arranged with a straight heat exchanging body 61. In one embodiment, besides the above-mentioned heat dissipation member 6 having the micro-channels, other types of heat dissipation members may be arranged. The present embodiments do not limit the specific structure of the heat dissipation member 6. In addition, other embodiments of the present disclosure in which the heat dissipation member is applied to the electric control box may employ the heat dissipation members in any forms as disclosed in the present disclosure or employ any heat dissipation member available in the art.

7.1 Cooling Medium in Heat Exchanging Body Having Fixed Flowing Direction

As described in the above, since the flowing direction of the cooling medium for cooling when the air conditioning system is in the refrigerating mode may be opposite to the flowing direction of the cooling medium for heating when the air conditioning system is in the heating mode, the temperature of the heat exchanging body 61 along the extension direction may change as the operating mode of the air conditioning system changes. It cannot be ensured that the temperature at the first end 61a is always higher than the temperature at the second end 61b. For example, in the air conditioning system 1 shown in FIG. 1, the flowing direction of the cooling medium in the first heat exchanging channel 610 (primary channel) in the refrigerating mode may be opposite to the flowing direction of the cooling medium in the first heat exchanging channel 610 (primary channel) in the cooling mode.

Therefore, as shown in FIG. 23, the electric control box further includes a first unidirectional guiding member 701, a second unidirectional guiding member 702, a third unidirectional guiding member 703 and a fourth unidirectional guiding member 704. An inlet of the first unidirectional guiding member 701 is connected to an end of the indoor unit (such as the indoor heat exchanger 5 in FIG. 1), and an outlet of the first unidirectional guiding member 701 is connected to the fluid-collecting tube assembly 62 near the first end 61a. An inlet of the second unidirectional guiding member 702 is connected to the fluid-collecting tube assembly 62 near the second end 61b, and an outlet of the second unidirectional guiding member 702 is connected to the end of the indoor unit. An inlet of the third unidirectional guiding member 703 is connected to an end of a flow adjustment valve (such as the expansion valve 13 in FIG. 1), and an outlet of the third unidirectional guiding member 703 is connected to the fluid-collecting tube assembly 62 near the first end 61a. An inlet of the fourth unidirectional guiding member 704 is connected to the fluid-collecting tube assembly 62 near the second end 61b, and an outlet of the fourth unidirectional guiding member is connected to the end of the flow adjustment valve.

The air conditioning system 1 is in the refrigerating mode. The cooling medium output from the compressor 2 flows to the outdoor heat exchanger 4 for heat exchanging. The cooling medium continues flowing to the flow adjustment valve (the expansion valve 13), and further flows through the third unidirectional guiding member 703 to enter the fluid-collecting tube assembly 62 near the first end 61a. Further, the cooling medium flows through the heat exchanging body 61 to reach the second end 61b. In this way, in the direction from the first end 61a to the second end 61b, heat exchanging may occur between the cooling medium and the secondary channel (i.e., the cooling medium may be sub-cooled). In this way, the temperature of the heat exchanging body 61 decreases in the direction from the first end 61a to the second end 61b. The cooling medium flowing from the second end 61b may flow through the second unidirectional guiding member 702 to reach the indoor heat exchanger 5 for heat exchanging.

The air conditioning system 1 is in the heating mode. The cooling medium output from the compressor 2 flows to the indoor heat exchanger 5 for heat exchanging. The cooling medium continues flowing to the electric control box 7, and further flows through the first unidirectional guiding member 701 to enter the fluid-collecting tube assembly 62 near the first end 61a. Further, the cooling medium flows through the heat exchanging body 61 to reach the second end 61b. In this way, in the direction from the first end 61a to the second end 61b, heat exchanging may occur between the cooling medium and the secondary channel (i.e., the cooling medium may be sub-cooled). In this way, the temperature of the heat exchanging body 61 decreases in the direction from the first end 61a to the second end 61b. The cooling medium flowing from the second end 61b may flow through the fourth unidirectional guiding member 704 to reach the outdoor heat exchanger 4 for heat exchanging.

Therefore, in the present disclosure, four unidirectional guiding members are arranged between the first end 61a and the second end 61b, allowing the cooling medium in the heat exchanging body 61 to flow along a fixed direction, and the electronic element 71 is always disposed on a higher temperature position of the heat exchanging body 61, preventing the electronic element 71 from contacting the generated condensed water.

In some embodiments, each of the first unidirectional guiding member 701, the second unidirectional guiding member 702, the third unidirectional guiding member 703 and the fourth unidirectional guiding member 704 may be configured as a one-way valve. In some embodiments, each of the first unidirectional guiding member 701, the second unidirectional guiding member 702, the third unidirectional guiding member 703 and the fourth unidirectional guiding member 704 may be configured as an electromagnetic valve. The present disclosure does not limit a type of the unidirectional guiding member.

8. Mounting Plate Prevents Condensed Water from Flowing Out

Figure 24:
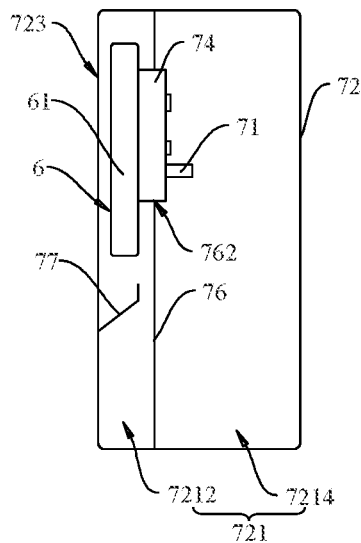
FIG. 24 is a cross sectional view of a heat dissipation member engaged with the electric control box according to another embodiment of the present disclosure.

As shown in FIG. 24, the electric control box 7 in the present embodiment includes a box body 72, a mounting plate 76, an electronic element 71 and a heat dissipation member 6.

The box body 72 defines a mounting cavity 721, and the mounting plate 76 is received in the mounting cavity 721, and the mounting cavity 721 is divided into a first cavity 7212 and a second cavity 7214 located on two sides of the mounting plate 76. The electronic element 71 is received in the second cavity 7214. At least a part of the heat exchanging body 61 is received in the first cavity 7212 and is thermal-conductively connected to the electronic element 71. The mounting plate 76 is configured to prevent the condensed water on the heat dissipation member 6 from flowing into the second cavity 7214.

The mounting plate 76 is arranged inside the electric control box 7 to divide the mounting cavity 721, and the heat exchanging body 61 and the electronic element 71 are respectively received in the first chamber 7212 and the second chamber 7214. In this way, the electronic element 71 may be completely separated from the condensed water, preventing the electronic element 71 from being short-circuited or damaged due to contacting the condensed water.

Further, the heat dissipation fixing plate 74 may be arranged to indirectly connect the electronic v 71 to the heat exchanging body 61.

In detail, the mounting plate 76 may define an avoidance hole 762 at a position corresponding to the heat dissipation fixing plate 74. The heat dissipation fixing plate 74 is connected to the heat exchanging body 61 and blocks the avoidance hole 762. The electronic element 71 is arranged on a side of the heat dissipation fixing plate 74 away from the heat exchanging body 61. In this way, the heat dissipation fixing plate 74 may be configured to enable the electronic element 71 to be thermal-conductively connected to the heat exchanging body 61. Further, the heat dissipation fixing plate 74 may be configured to separate the first cavity 7212 from the second cavity 7214. Therefore, the condensed water may be prevented from flowing through the avoidance hole 762 to reach the second cavity 7214 in which the electronic element 71 is arranged, and the condensed water may be prevented from contacting the electronic element 71.

Further, when a large amount of condensed water is generated on the heat exchanging body 61, the condensed water may be accumulated and fall due to the gravitational force. The dropped condensed water may generate noise, and condensed water, which is rapidly distributed, may not be discharged out of the electric control box 7 easily.

Therefore, as shown in FIG. 24, a guiding plate 77 is arranged inside the electric control box 7. The guiding plate 77 may be arranged on a lower side of the heat dissipation member 6 to collect the condensed water dripping from the heat dissipation member 6. By arranging the guiding plate 77, a height that the condensed water drops may be reduced, and the noise may be reduced. Further, the guiding plate 77 may accumulate the condensed water, and the condensed water may be accumulated and further discharged out of the electric control box 7.

As shown in FIG. 24, the heat dissipation member 6 is fixed to the bottom plate 723 of the electric control box 7. An end of the guiding plate 77 is connected to the bottom plate 723, and the other end of the guiding plate 77 extends towards an interior of the first cavity 7212.

Further, a projection of the heat dissipation member 6 along the vertical direction locates in the guiding plate 77. In this way, the condensed water from the heat dissipation member 6 drops to reach the guiding plate 77, preventing the condensed water from dropping to reach other locations of the electric control box 7.

It shall be understood that, the heat dissipation member 6 may be arranged on the mounting plate 76. In this case, an end of the guiding plate 77 is connected to the mounting plate 76, and the other end of the guiding plate 77 extends towards the interior of the first cavity 7212. Further, the projection of the heat dissipation member 6 along the vertical direction is located in the guiding plate 77.

Figure 25:
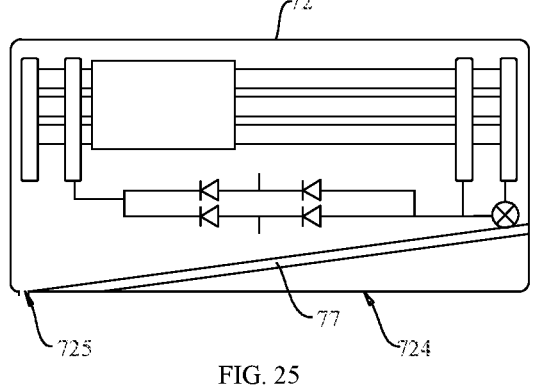
FIG. 25 is a planar view of a heat dissipation member engaged with the electric control box according to another embodiment of the present disclosure.

Further, as shown in FIG. 25, in order to discharge the condensed water on the guiding plate 77 out of the electric control box 7 in time, a drainage hole 725 may be defined in a bottom wall of the box body 72, and the guiding plate 77 may be inclined at an angle with respect to the bottom wall of the box body 72. The condensed water is guided by the guiding plate 77 and discharged from the box body 72 through the drainage hole 725.

In detail, the drainage hole 725 may be defined in the circumferential side plate 724 of the electric control box 7. The guiding plate 77 is connected to the mounting plate 76 or the bottom plate 723 of the box body 72 and is inclined towards the drainage hole 725. After the condensed water drops on the guiding plate 77, the condensed water may flow along the inclined guiding plate 77 to be collected at the position where the drainage hole 725 is defined, and may be drained out of the electric control box 7 from the drainage hole 725.

The number and sizes of drainage holes 725 may be determined flexibly based on the amount of condensed water, and will not be limited herein.

In the present embodiment, the flowing direction of the cooling medium in the heat exchanging body 61 may be configured to be the horizontal direction. That is, the extension direction of the heat exchanging body 61 may be the horizontal direction. On one hand, a path that the condensed water flows in the heat exchanging body 61 may be reduced, and the condensed water may drop down to the guiding plate 77 due to the gravitational force as soon as possible, enabling the condensed water to be discharged out of the electric control box 7 in time, preventing the condensed water from contacting the electronic element 71 arranged inside the mounting cavity 721. On the other hand, the guiding plate 77 may be prevented from interfering with the heat exchanging body 61, and a relatively long heat exchanging body 61 may be arranged, improving the heat exchanging efficiency of the heat dissipation member 6.

Figure 26:
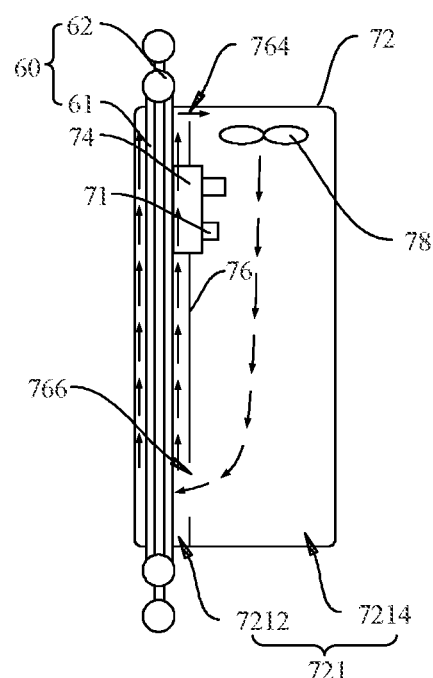
FIG. 26 is a cross sectional view of a heat dissipation member engaged with the electric control box according to another embodiment of the present disclosure.

9. Heat Dissipation Plate Arranged at Position of Heat Dissipation Member Having High Temperature, and Condensed Water Being Vaporized to Dissipate Heat As shown in FIG. 26, the electric control box 7 in the present embodiment includes a box body 72, a mounting plate 76 and a heat dissipation member 6.

The box body 72 defines a mounting cavity 721, and the mounting plate 76 is received in the mounting cavity 721, and the mounting cavity 721 is divided into a first cavity 7212 and a second cavity 7214 located on two sides of the mounting plate 76. The mounting plate 76 defines a first air vent 764 and a second air vent 766. The first air vent 764 and the second air vent 766 are spaced apart from each other. In this way, gas in the first cavity 7212 flows into the second cavity 7214 via the first air vent 764 and gas in the second cavity 7214 flows into the first cavity 7212 via the second air vent 766. At least a part of the heat exchanging body 61 is received in the first cavity 7212. A flowing direction of a part of the cooling medium in the heat exchanging body 61 is configured to be a direction that the first air vent 764 is spaced apart from the second air vent 766. The temperature of the heat exchanging body 61 gradually increases in the direction from the second air vent 766 to the first air vent 764. That is, a temperature of a position of the heat exchanging body 61 near the first air vent 764 is higher than a temperature of a position of the heat exchanging body 61 near the second air vent 766. As described above, the cooling medium herein may be the cooling medium in the primary channel or in the secondary channel in the air conditioning system shown in FIG. 1.

In the present embodiment, the heat exchanging body 61 may be arranged in the horizontal direction, in the vertical direction or in other directions, which will not be limited herein. In addition, the number, positions and extension directions of first air vents 764 and second air vents 766 are not limited herein.

Since the temperature of a side of the heat exchanging body 61 near the second air vent 766 is low, the amount of condensed water generated at the position near the second air vent 766 may be large. In the present embodiment, the mounting plate 76 is arranged inside the electric control box 7 and defines the first air vent 764 and the second air vent 766 along the flowing direction of the cooling medium, and the first air vent 764 may be spaced apart from the second air vent 766. When the high temperature air in the second cavity 7214 enters the first cavity 7212 through the second air vent 766, the air may contact the condensed water, and the condensed water may be vaporized. In this way, on one hand, the condensed water may be prevented from being accumulated, and drainage structures may be omitted. On the other hand, the condensed water may be vaporized and absorb heat to reduce the temperature of the heat dissipation member 6. The temperature of the cooling medium in the heat dissipation member 6 may be reduced, and the heat exchanging performance of the heat dissipation member 6 may be improved.

To be noted that, the flowing direction of the cooling medium in the heat exchanging body 61 is configured to be a direction that the first air vent 764 is spaced apart from the second air vent 766. In this case, the flowing direction of the cooling medium may be parallel to or may be at an angle relative to direction that the first air vent 764 is spaced apart from the second air vent 766.

As described in the above, since the air conditioners generally have the refrigerating mode and the heating mode, the flowing direction of the cooling medium in the refrigerating mode may be opposite to the flowing direction of the cooling medium in the heating mode. Therefore, the priority is given to the refrigerating mode, the temperature of the heat exchanging body 61 is ensured to increase gradually in the direction from the second air vent 766 to the first air vent 764. Reasons will be explained in the following.

When the ambient temperature is low, for example, when the air conditioning apparatus is operating to heat the environment in winter, the temperature of the air inside the electric control box 7 is low, the temperature difference between the air inside the electric control box 7 and the heat dissipation member 6 is small. The air may not be condensed into water easily. When the ambient temperature is high, for example, when the air conditioning apparatus is operating to cool the environment in summer, the temperature of the air in the electric control box 7 is high, and the temperature difference between the air in the electric control box 7 and the heat dissipation member 6 is high. Therefore, the air may be easily condensed into water. Therefore, in the present embodiment, at least in the refrigerating mode, the temperature of the heat exchanging body 61 may gradually increase in the direction from the second air vent 766 to the first air vent 764, preventing the condensed water from being generated on the heat dissipation member 6 in the refrigerating mode.

Further, the electric control box 7 may further include an electronic element 71, and the electronic element 71 is thermal-conductively connected to the heat dissipation member 6, and heat may be dissipated from the electronic element 71 by the heat dissipation member 6.

In some embodiments, the electronic element 71 may be received in the first cavity 7212. In order to reduce the possibility that the electronic element 71 contacts the condensed water, the electronic element 71 may be arranged at a position of the heat exchanging body 61 near the first air vent 764 and may be thermal-conductively connected to the heat exchanging body 61.

In detail, while air is flowing from the second air vent 766 to the first air vent 764, heat exchanging may continuously occur between the air and the heat dissipation member 6, the temperature of the air gradually decreases. Further, the temperature of the heat exchanging body 61 near the first air vent 764 is high, and therefore, the temperature difference between the air and the heat dissipation member 6 may be reduced to reduce a possibility that the air is condensed at the position of the heat exchanging body 61 near the first air vent 764. The electronic element 71 is arranged at the position of the heat exchanging body 61 near the first air vent 764. In this way, the electronic element 71 may be prevented from contacting condensed water, and the electronic element 71 arranged on the heat exchanging body 61 may be protected.

In some embodiments, the first air vent 764 and the second air vent 766 may be spaced apart from each other along the horizontal direction. In this case, the extension of the heat exchanging body 61 may be along the horizontal direction. When the amount of the condensed water generated near the second air vent 766 is excessively large and cannot be vaporized in time, the condensed water may flow down in the vertical direction. Since the length of the heat exchanging body 61 in the vertical direction is small, the condensed water may leave the heat exchanging body 61 after flowing for an distance, resulting in the condensed water being dropped.

Therefore, in order to avoid the condensed water from being dropped, the first air vent 764 and the second air vent 766 may be spaced apart from each other along the vertical direction, the first air vent 764 is arranged at an upper of the second air vent 766, and the extension direction of the heat exchanging body 61 may be the vertical direction. In this case, when the amount of the condensed water generated near the position of the second air vent 766 is excessively large and cannot be vaporized in time, the condensed water may flow along the vertical direction. Since the length of the heat exchanging body 61 is large along the vertical direction, a flowing path of the condensed water may be increased, and the contact area between the hot air and the condensed water may be increased, and the amount of the condensed water that may be vaporized may be increased, and the condensed water may be prevented from being dropping. The first air vent 764 is arranged at the upper of the second air vent 766, and the electronic element 71 is arranged at the position near the first air vent 764, and the condensed water may flow in a direction away from the electronic element 71, and the electronic element 71 may be prevented from contacting the condensed water.

In some embodiments, the electronic element 71 may also be arranged inside the second cavity 7214 and may be thermal-conductively connected to the heat dissipation member 6 via the heat dissipation fixing plate 74. Connection between the electronic element 71 and the heat dissipation fixing plate 74 may be the same as and referred to the above embodiments.

Further, in order to increase a flowing speed of air in the first cavity 7212 and in the second cavity 7214, a cooling fan 78 may be arranged inside the electric control box 7 to increase the air ventilation effect of the first cavity 7212 and the second cavity 7214.

As shown in FIG. 26, the cooling fan 78 may be received in the second cavity 7214.

The cooling fan 78 in the second cavity 7214 may provide a forced ventilation enables the air to flow from the second air vent 766 to the first cavity 7212.

In detail, since the electronic element 71 is received in the second cavity 7214, the heat generated while the electronic element 71 is operating may enable the temperature in the second cavity 7214 to be higher than the temperature in the first cavity 7212. By arranging the cooling fan 78 in the second cavity 7214, the speed that the high temperature air flows from the second air vent 766 to the first cavity 7212 may be increased in order to enhance the speed that the condensed water is vaporized.

Further, the cooling fan 78 may be arranged at the position near the first air vent 764 to increase a distance between the cooling fan 78 and the second air vent 766, increasing an operating range of the cooling fan 78, and the cooling fan 78 may drive more air to flow into the second air vent 766.

Further, a temperature sensor (not shown in the drawings) may be arranged inside the electric control box 7. The temperature sensor may be configured to detect the temperature in the second cavity 7214. In this way, when the temperature sensor detects that the temperature in the second cavity 7214 is greater than a temperature threshold, the cooling fan 78 may be controlled to start operating, or an operating speed of the cooling fan 78 may be increased.

In detail, the temperature sensor may be arranged within the second cavity 7214 of the electric control box 7 to detect the temperature of the second cavity 7214. When the heat generated due to the electronic element 71 being operating is relatively large, causing the temperature inside the second cavity 7214 to be greater than the temperature threshold, the temperature sensor may be triggered and transmit a high temperature trigger signal to a main board. The main board may turn on the cooling fan 78 to accelerate the flowing speed of the air inside the second cavity 7214, and a speed that the air circulates between the first cavity 7212 and the second cavity 7214 may be increased, and the speed that the condensed water is vaporized may be increased. When the temperature within the second cavity 7214 decreases and is below the temperature threshold, the temperature sensor may be triggered and transmit a low temperature trigger signal to the main board, and the main board may turn off the cooling fan 78 to save energy.

The value of the temperature threshold may be determined as required and will not be limited by the present disclosure.

Figure 27:
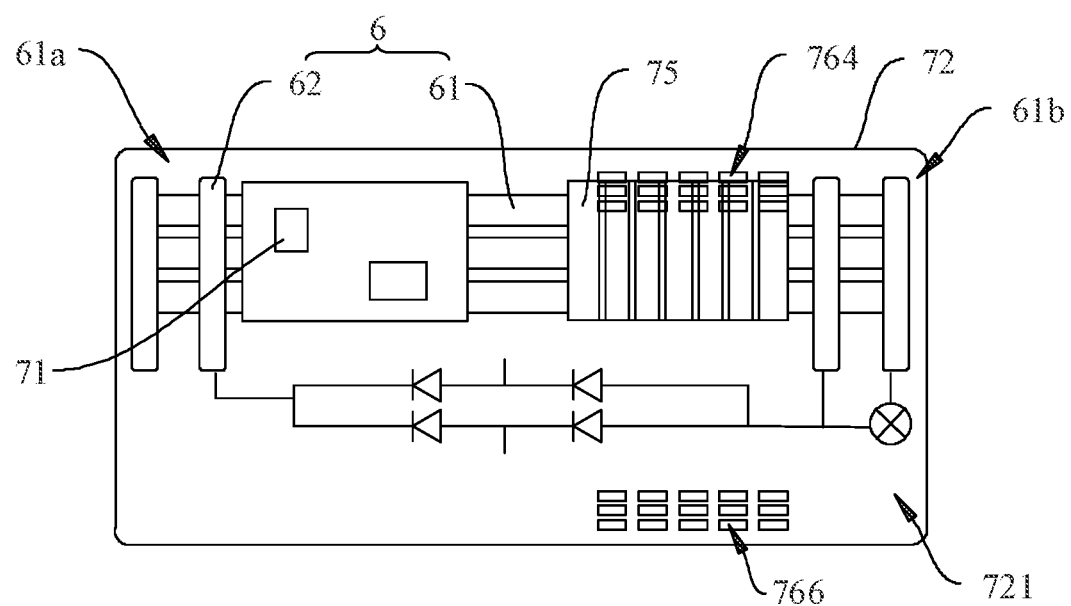
FIG. 27 is a planar view of a heat dissipation member engaged with the electric control box according to another embodiment of the present disclosure.

10. Arranging Heat Dissipation Plate on Upstream of Heat Dissipation Member, Arranging Heat Dissipation Fin on Downstream of Heat Dissipation Member As shown in FIG. 27, the electric control box 7 in the present embodiment includes a box body 72, a heat dissipation member 6, an electric element 71 and a heat dissipation fin 5.

The box body 72 defines a mounting cavity 721. At least a part of the heat exchanging body 61 is received in the mounting cavity 721. The electronic element 71 is thermal-conductively connected to the heat exchanging body 61 at a first position, and the heat dissipation fin 75 is thermal-conductively connected to the heat exchanging body 61 at a second position. The first position and the second position are spaced apart from each other along the flowing direction of the cooling medium of the heat exchanging body 61. As described above, the cooling medium herein may be the cooling medium in the primary channel or in the secondary channel in the air conditioning system shown in FIG. 1.

In the present embodiment, the electronic element 71 and the heat dissipation fin 75 are spaced apart from each other along the flowing direction of the cooling medium of the heat exchanging body 61. The space on the heat exchanging body 61 may be optimally utilized. The heat exchanging body 61 may dissipate heat from the electronic element 71. Further, the heat dissipate fin 75 may be configured to reduce the temperature in the mounting cavity 721 of the electric control box 7, and the electronic elements 71 arranged inside the mounting cavity 721 may be protected.

Further, the heat exchanging body 61 includes the first end 61a and the second end 61b. The first end 61a and the second end 61b are spaced apart from each other along the flowing direction of the cooling medium. The temperature of the heat exchanging body 61 decreases gradually in the direction from the first end 61a to the second end 61b. That is, the temperature of the first end 61a is higher than the temperature of the second end 61b. Compared to the second position, the first position may be closer to the first end 61a.

In detail, while the heat exchanging body 61 is operating, since the temperature of the surface of the heat exchanging body 61 may change along with the flowing direction of the cooling medium, the temperature of the first end 61a may be higher than the temperature of the second end 61b. Since a temperature difference between the higher temperature first end 61a and the hot air in the mounting cavity 721 is relatively small, the condensed water may be less likely generated. Therefore, the electronic element 71 may be arranged near the first end 61a, i.e., the first position is a position near the first end 61a. Since a temperature difference between the lower temperature second end 61b and the hot air in the mounting cavity 721 is relatively large, the condensed water may be more likely generated. Therefore, the heat dissipation fin 75 may be arranged near the second end 61b. On one hand, the lower temperature of the heat dissipation fin 75 may allow the temperature difference between the heat dissipation fin 75 and the hot air to be large, and the heat may be dissipated from the electric control box 7. On the other hand, the condensed water formed on the heat dissipation fin 75 may be vaporized due to the hot air. Evaporation of the condensed water may absorb heat to further reduce the temperature of the cooling medium, improving the heat exchanging effect of the heat dissipation member 6.

10.1 Increasing Flowing Speed of Heat Dissipation Air

Further, the cooling fan 78 is arranged inside the electric control box 7. The cooling fan 78 is configured to generate a heat dissipation airflow on the heat dissipation fin 75 in the electric control box 7. In this way, the flowing speed of the heat dissipation airflow may be increased, improving the heat exchanging effect.

In some embodiments, the cooling fan 78 may be arranged at a position near the heat dissipation fin 75 to act directly on the heat dissipation fin 75.

Figure 28:
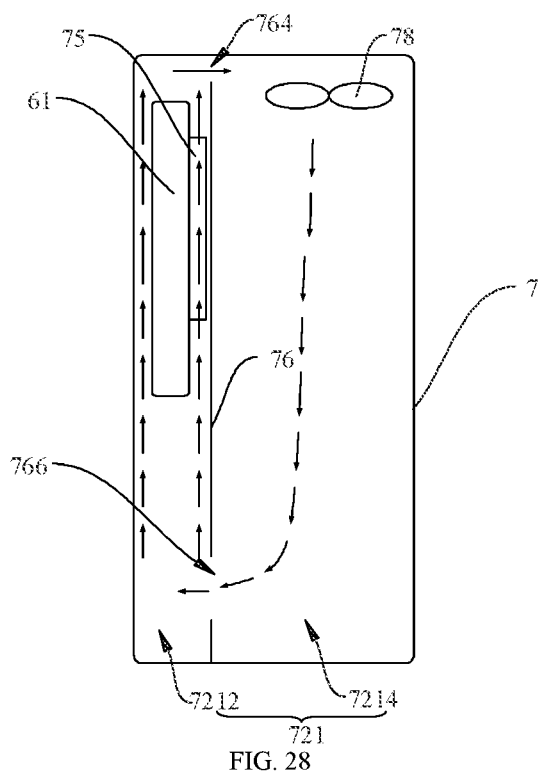
FIG. 28 is a cross sectional view of the heat dissipation member engaged with the electric control box shown in FIG. 27.

In some embodiments, as shown in FIG. 28, the mounting plate 76 is arranged inside the electric control box 7. The mounting plate 76 is received in the mounting cavity 721, and the mounting cavity 721 is divided into the first cavity 7212 and the second cavity 7214, and the first cavity 7212 and the second cavity 7214 are located on two sides of the mounting plate 76, respectively. The mounting plate 76 defines the first air vent 764 and the second air vent 766 spaced apart from the first air vent 764, and the gas in the first cavity 7212 flows into the second cavity 7214 through the first air vent 764, and the gas in the second cavity 7214 flows into the first cavity 7212 through the second air vent 766. At least a part of the heat exchanging body 61 is received in the first cavity 7212, and the electronic element 71 and the cooling fan 78 are received in the second cavity 7214.

In the present embodiment, the mounting plate 76 is configured to divide the mounting cavity 721 into two independent cavities, the first cavity 7212 and the second cavity 7214, and a circulating airflow may be generated in the first cavity 7212 and the second cavity 7214. Therefore, the amount of air that contacts the heat dissipation fin 75 received in the first cavity 7212 may be increased, and cooled air may dissipate heat from the electronic element 71 received in the second cavity 7214, airflows may not be mixed, and the heat dissipation efficiency of the heat dissipation fin 75 may be improved.

The cooling fan 78 received in the second cavity 7214 is configured to increase the flowing speed of the air in the second cavity 7214, and the speed that the air circulates between the first cavity 7212 and the second cavity 7214 may be increased, and the efficiency of dissipating heat from the electric control box 7 may be increased.

Further, a direction that the heat dissipation air flows along the heat dissipation fin 75 may be configured to be perpendicular to the flowing direction of the cooling medium.

As shown in FIG. 27 and FIG. 28, when the cooling medium in the heat exchanging body 61 is flowing in the horizontal direction, the heat dissipation air may be configured to flow in the vertical direction, and the heat dissipation air may not flow to the position where the electronic element 71 is arranged.

In detail, the first air vent 764 and the second air vent 766 may be spaced apart from each other along the vertical direction and are disposed on opposite sides of the heat dissipation fin 75. The number and an arrangement density of first air vents 764 and the number and an arrangement density of second air vents 766 may be determined based on demands.

In some embodiments, when the cooling medium in the heat exchanging body 61 is flowing in the vertical direction, the heat dissipation air may be configured to flow in the horizontal direction, and the heat dissipation air may not flow to the position where the electronic element 71 is arranged. In some embodiments, the flowing direction of the heat dissipation air and the flowing direction of the cooling medium may be along another two perpendicular directions, which will not be limited by the present disclosure.

Further, when the first air vent 764 and the second air vent 766 are arranged in the vertical direction, the first air vent 764 may be arranged at an upper of the second air vent 766, and the hot air entering the first cavity 7212 through the second air vent 766 may automatically flow to the position where the heat exchanging body 61 is arranged, and heat exchanging may occur between the hot air and the heat exchanging body 61.

In some embodiments, the cooling fan 78 may be arranged at the position near the first air vent 764, and cold air located at a top of the first cavity 7212 may enter the second cavity 7214 in time, and the cooling fan 78 may accelerate the cold air to increase the efficiency of dissipating heat from the electronic element 71.

11. Internal Circulation

Generally, in order to cool down the electric control box 7, a heat dissipation hole may be defined in the box body 72 of the electric control box 7 and may be communicated with the mounting cavity 721, and the air inside the box may be circulated with the air out of the box to achieve heat exchanging, and the electric control box 7 may be cooled down. However, when the box body 72 defines the heat dissipation hole, air tightness of the electric control box 7 may be reduced, impurities, such as water and dust at the outside of the box, may enter the mounting cavity 721 through the heat dissipation hole, and the electronic element arranged in the mounting cavity 721 may be damaged.

In the present embodiment, in order to solve the above problem, the box body 72 of the electric control box 7 may be configured as a sealed box body. In detail, as shown in FIG. 29, the electric control box 7 may include the box body 72, the mounting plate 76, the heat dissipation member 6, the electronic element 71 and the cooling fan 78.

The box body 72 defines the mounting cavity 721. The mounting plate 76 is received in the mounting cavity 721, and the mounting cavity 721 is divided into the first cavity 7212 and the second cavity 7214, and the first cavity 7212 and the second cavity 7214 are located on two sides of the mounting plate 76, respectively. The mounting plate 76 defines the first air vent 764 and the second air vent 766 spaced apart from the first air vent 764. The first air vent 764 and the second air vent 766 are communicated with the first cavity 7212 and the second cavity 7214. At least a part of the heat exchanging body 61 is received in the first cavity 7212, and the electronic element 71 is received in the second cavity 7214 and is thermal-conductively connected to the heat dissipation member 6. The cooling fan 78 is configured to supply air, and the gas in the first cavity 7212 flows into the second cavity 7214 through the first air vent 764.

In the present embodiment, at least a part of the heat dissipation member 6 is received in the first cavity 7212, and the electronic element 71 and the cooling fan 78 are received in the second cavity 7214. The mounting plate 76 defines the first air vent 764 and the second air vent 766 spaced apart from the first air vent 764, and the first air vent 764 and the second air vent 766 are communicated with the first cavity 7212 and the second cavity 7214. In this way, the heat generated by the electronic element 71 causes the air in the second cavity 7214 to be increased, the cooling fan 78 drives the hot air to flow into the second air vent 766. Since the hot air has a low density, the hot air may flow upwardly to contact the heat dissipation member 6 received in the first cavity 7212. The heat dissipation member 6 may cool the hot air into cold air. The cold air flows into the second cavity 7214 through the first air vent 764. The cooling fan 78 is configured to accelerate the flowing speed of the cold air. In this way, the cold air may be taken to cool the electronic element 71 received in the second cavity 7214. A temperature of the cold air, which exchanges heat with the electronic element 71, may be increased, and the cold air, which has the increased temperature, may be driven by the cooling fan 78 to enter the second air vent 766. The above circulation may occur periodically. In this way, the internal circulation may be generated to cool the electronic element 71 received in the electric control box 7. Compared to defining the heat dissipation hole in the electric control box 7 to cool the control box, in the present embodiment, the electric control box 7 may be completely sealed, and waterproof, insect-proof, dust-proof and moisture-proof may be achieved, and the reliability of the electric control box 7 may be improved.

Figure 29:
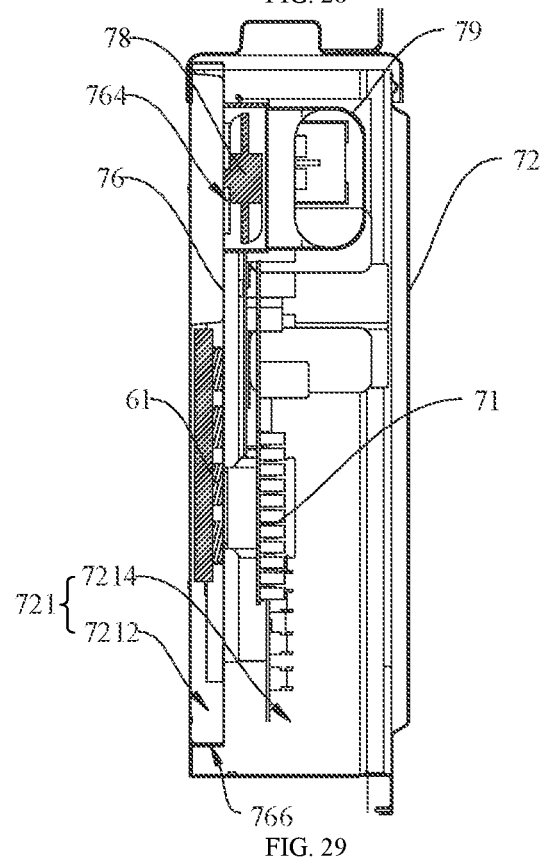
FIG. 29 is a cross sectional view of the heat dissipation member engaged with the electric control box according to another embodiment of the present disclosure.

As shown in FIG. 29, the cooling fan 78 is mounted in the first air vent 764. A plane in which the cooling fan 78 is located may be coplanar with a plane in which the mounting plate 76 is located.

In detail, the cooling fan 78 may be fixedly arranged in the first air vent 764 by a fan bracket (not shown in the drawings). The plane in which the cooling fan 78 is located may refer to a plane perpendicular to a direction of a rotational axis of the cooling fan 78. Since the cooling fan 78 is arranged in the first air vent 764, a distance between the cooling fan 78 and the first cavity 7212 may be reduced, and the cold air may be easily discharged out of the first cavity 7212. Further, the cooling fan 78 may not occupy any space of the second cavity 7214, and elements inside the electric control box 7 may be arranged more compact, and the size of the electric control box 7 may be reduced.

The electronic element 71 is usually arranged on the mounting plate 76. Therefore, when the plane in which the cooling fan 78 is located is coplanar with the plane in which the mounting plate 76 is located, the flowing direction of the air of the cooling fan 78 may be perpendicular to the plane in which the mounting plate 76 is located. In this way, the flowing direction of the air of the cooling fan 78 may not act directly on the electronic element 71, and a path that the air flows in the second cavity 7214 may be increased.

Therefore, as shown in FIG. 11 and FIG. 29, an air guiding cover 79 may be arranged inside the electric control box 7. The air guiding cover 79 may be arranged to cover a periphery of the cooling fan 78 and configured to guide the air blown by the cooling fan 78, and the air blown from the cooling fan 78 may be directed towards the electronic element 71.

In detail, the air guiding cover 79 is connected to the mounting plate 76. An air outlet of the air guiding cover 79 faces towards the position where the electronic element 71 is arranged. In this way, the air blown by the cooling fan 78, after being guided by the air guiding cover 79, may flow to the position where the electronic element 71 is arranged. On one hand, the cold air may act directly on the electronic element 71 to increase the efficiency of dissipating heat from the electronic element 71. On the other hand, the air guiding cover 79 may increase a speed that the cold air flows through the electronic element 71, and the efficiency of dissipating heat from the electronic element 71 may further be improved.

Figure 30:
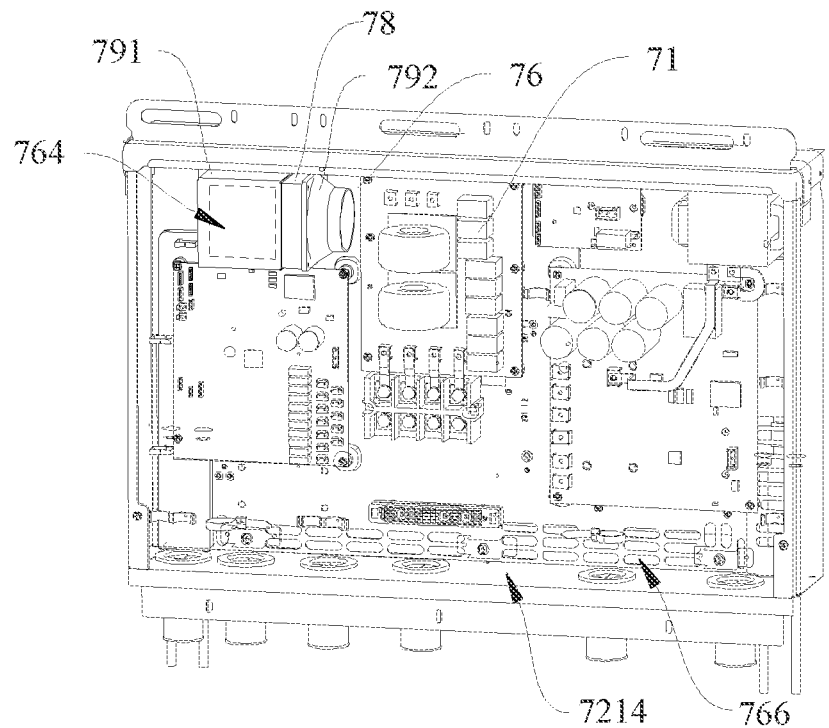
FIG. 30 is a perspective view of an electric control box omitting some components according to another embodiment of the present disclosure.

In an embodiment, as shown in FIG. 30, the plane in which the cooling fan 78 is located is perpendicular to the plane in which the mounting plate 76 is located, and a leeward side of the cooling fan 78 may face towards the first air vent 764.

In detail, the cooling fan 78 may be arranged on a side of the mounting plate 76 facing the second cavity 7214. The direction of the rotational axis of the cooling fan 78 may be parallel to the plane in which the mounting plate 76 is located. The leeward side of the cooling fan 78 may refer to an air inlet side of the cooling fan 78. In the present embodiment, the cooling fan 78 may be disposed between the first air vent 764 and the electronic element 71. The cold air that enters the second cavity 7214 via the first air vent 764 is accelerated by the cooling fan 78 and subsequently flows out, and the flowing speed of the cold air may be increased, and the efficiency of dissipating heat from the electric control box 7 may be increased.

Further, as shown in FIG. 30, in order to enable the entire cold air that enters through the first air vent 764 to be accelerated by the cooling fan 78, the electric control box 7 may further define a return air duct 791. The return air duct 791 may be communicated between the first air vent 764 and the cooling fan 78 to direct the air in the first cavity 7212 to flow to the cooling fan 78. In this way, the cold air that enters through the first air vent 764 is all directed to the cooling fan 78 through the return air duct 791 and is accelerated by the cooling fan 78, and the flowing speed of the cold air may be increased, and the efficiency of dissipating heat from the electric control box 7 may be increased.

Further, as shown in FIG. 30, the electric control box 7 may further define an air supply duct 792. The air supply duct 792 may be connected to a side of the cooling fan 78 away from the return air duct 791 and configured to guide the air blown by the cooling fan 78, and the air, after being guided by the air supply duct 792, may be directed towards the electronic element 71.

In detail, the air supply duct 792 may be configured to direct the air blown by the cooling fan 78, and the air blown out of the cooling fan 78 may be directed towards the electronic element 71. In this way, a proportion of the cool air flowing to the position where the electronic element 71 is arranged may be increased, and the efficiency of dissipating heat from the electronic element 71 may be increased.

Figure 31:
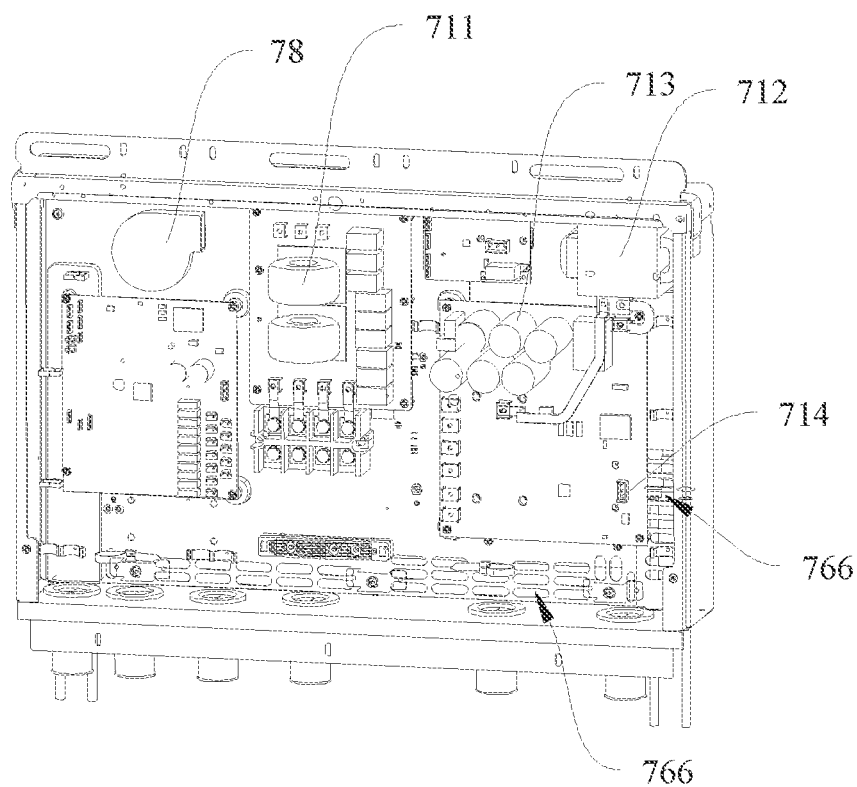
FIG. 31 is a perspective view of an electric control box omitting some components according to another embodiment of the present disclosure.

In some embodiments, as shown in FIG. 31, the cooling fan 78 may be a centrifugal fan.

For the centrifugal fan, a mechanical energy input to the fan may be taken to increase an air pressure, and the air may be output. A working principle of the centrifugal fan may refer to taking a high-speed rotating impeller to accelerate the air. Therefore, in the present embodiment, the cooling fan 78 is configured as the centrifugal fan. On one hand, a high speed cold air may be obtained to improve the efficiency of cooling the electronic element 71. On the other hand, compared to the cooling fan 78 with the return air duct 791 and air supply duct 792, the centrifugal fan may have a simplified structure, an efficiency of mounting the cooling fan 78 may be increased.

In some embodiments, when electronic elements 71 are rapidly distributed, arranging the air guiding cover 79 and defining the air supply duct 792 may allow the direction of the guided air to be fixed. Although efficiencies of dissipating heat from some electronic elements 71 that are located along the air flowing direction may be increased, electronic elements 71 that are highly deviated from the air flowing direction may not be cooled effectively.

Therefore, air guiding plates (not shown in the drawings) may be spaced apart from each other and arranged on the mounting plate 76. An air guiding channel may be formed between adjacent air guiding plates and configured to direct the air blown by the cooling fan 78.

For example, two parallel air guiding plates, which are spaced apart from each other, may be arranged between the rapidly distributed electronic elements 71. An extension direction of the air guiding plate may follow a direction that the electronic elements 71 are spaced apart from each other, and the two air guiding plates may define the air guiding channel along the direction that the electronic elements 71 are spaced apart from each other. The cool air blown by the cooling fan 78 firstly flows to positions of a part of the electronic elements 71 to dissipate heat from the part of electronic elements 71. The air that passes through the part of the electronic elements 71 further flows along the air guiding channel to reach positions of another part of the electronic elements 71 for dissipating heat from the another part of the electronic elements 71. In this way, the heat of the electronic elements 71 may be dissipated uniformly, temperatures of a part of electronic elements 71 may not be excessively high, and the part of electronic elements 71 may not be damaged.

The heat dissipation member 6 may be arranged inside the electric control box 7. That is, the heat exchanging body 61 may be arranged inside the first cavity 7212 to cool the air in the first cavity 7212.

In some embodiments, the heat dissipation member 6 may be arranged on the outside of the electric control box 7, and at least a part of the heat dissipation member 6 is extending into the first cavity 7212. For example, when the heat dissipation member 6 includes the heat exchanging body 61, the fluid-collecting tube assembly 62 and the heat dissipation fin 75, the box body 72 may define an assembly port (not shown) communicated with the first cavity 7212. In this case, the heat exchanging body 61 is connected to an outer wall of the box body 72, and the heat dissipation fin 75 is connected to the heat exchanging body 61 and inserted into the first cavity 7212 through the assembly port.

In the present embodiment, engagement between the heat dissipation member 6 and the electric control box 7 may be the same as and may be refer to the engagement described in the above embodiments, and will not be repeated herein.

As shown in FIG. 31, the electronic element 71 may be disposed within a range covered by the air supplied by the cooling fan 78, and the cooling fan 78 may act directly on the electronic elements 71 to cool the electronic elements 71.

The electronic elements 71 may include primary heating elements and secondary heating elements. The primary heating elements, such as a common mode inductor 711, a reactor 712 and a capacitor 713, may generate a large amount of heat. The secondary heating elements, such as a fan module 714, may generate less heat. In order to improve the efficiency of dissipating heat from the primary heating elements, a distance between the primary heating elements and the first air vent 764 may be configured to be less than a distance between the secondary heating elements and the first air vent 764. That is, the primary heating elements, which may generate larger amount of heat, may be arranged at positions near the first air vent 764. The secondary heating elements, which may generate less amount of heat, may be arranged at positions away from the first air vent 764. In this way, the air, which has a relatively low temperature and enters through the first air vent 764, may firstly act on the primary heating elements which may generate larger amount of heat, and the efficiency of dissipating heat from the primary heating elements, which may generate larger amount of heat, may be increased.

In some embodiments, the second air vent 766 may be defined at an end of the air supplied by the cooling fan 78 and at a position near the electronic elements 71, which may generate larger amount of heat. On one hand, an operating range of the cooling fan 78 may be expanded, and a circulation efficiency of the air in the second cavity 7214 may be increased. On the other hand, the hot air, after exchanging heat with the electronic elements 71 which may generate larger amount of heat, may be discharged from the second cavity 7214 in time, preventing the temperature of the second cavity 7214 from being increased.

Further, the second air vent 766 may be defined at a position near the first air vent 764 to reduce a path that the air circulates in the second cavity 7214, a resistance to air flowing may be reduced, an air circulation efficiency may be increased, and the efficiency of dissipating heat from the electric control box 7 may be improved.

Further, a size of the first air vent 764 and a size of the second air vent 766 may be determined based on the arrangement of the electronic elements 71.

In detail, second air vents 766 may be defined. The second air vents 766 may be defined at different positions of the mounting plate 76. A size of the second air vent 766 defined at the position near the electronic elements 71, which generate larger amount of heat, may be relatively large. The number of second air vents 766 near the primary electronic elements may be relatively large. The second air vents 766 near the primary electronic elements may be densely distributed. A size of the second air vent 766 defined at the position near the electronic elements 71, which generate less amount of heat, may be relatively small. The number of second air vents 766 near the primary electronic elements may be relatively less. The second air vents 766 near the primary electronic elements may be less-densely distributed.

Further, a size of the first air vent 764 may be larger than a size of the second air vent 766 to increase an amount of returned airflow, improving the efficiency of the cooling fan 78.

12. Natural Air Convection

Figure 32:
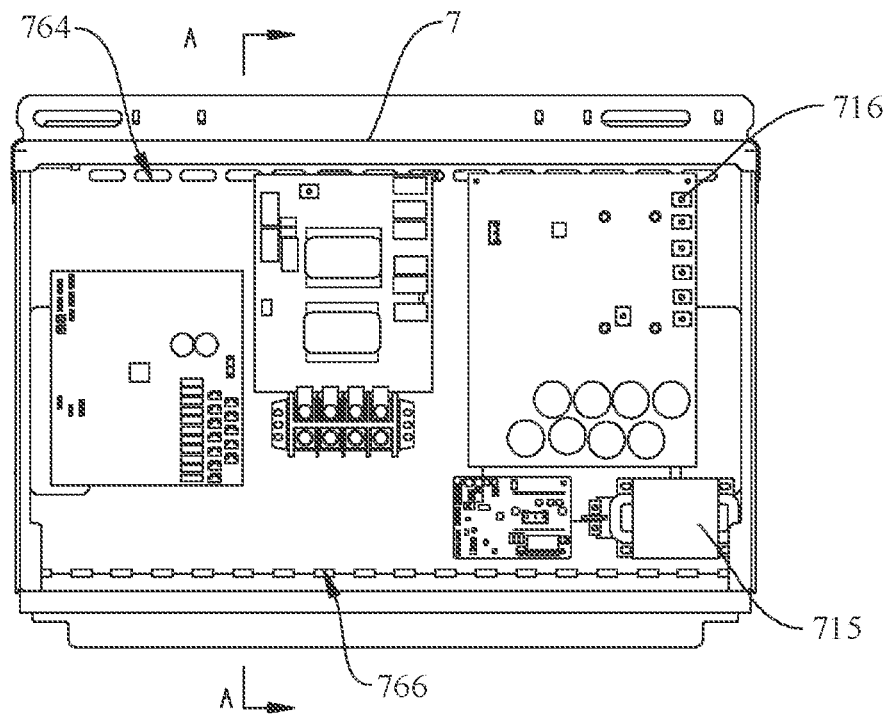
FIG. 32 is a planar view of an electric control box omitting some components according to another embodiment of the present disclosure.
Figure 33:
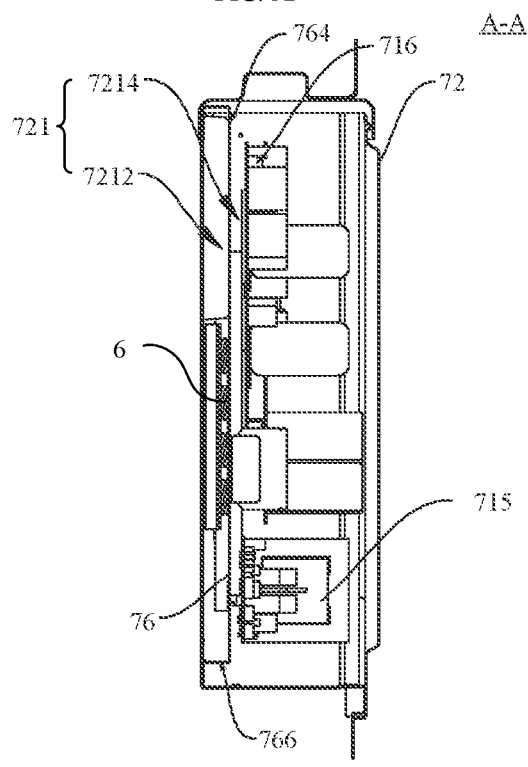
FIG. 33 is a cross sectional view of the electric control box shown in FIG. 32.

As shown in FIG. 32 and FIG. 33, the electric control box 7 may include the box body 72, the mounting plate 76, the heat dissipation member 6 and the primary heating element 715.

The box body 72 defines the mounting cavity 721. The mounting plate 76 is received in the mounting cavity 721, and the mounting cavity 721 is divided into the first cavity 7212 and the second cavity 7214, and the first cavity 7212 and the second cavity 7214 are located on two sides of the mounting plate 76, respectively. The mounting plate 76 defines the first air vent 764 and the second air vent 766 spaced apart from the first air vent 764. The first air vent 764 and the second air vent 766 are arranged in the vertical direction. At least a part of the heat dissipation member 6 is received in the first cavity 7212. The primary heating element 715 is received in the second cavity 7214. The first air vent 764 and the second air vent 766 are communicated to the first cavity 7212 and the second cavity 7214, and a circulating air flow for heat dissipation may be generated between the first cavity 7212 and the second cavity 7214 by taking a temperature difference between the primary heating element 715 and the heat dissipation member 6.

In detail, the primary heating element 715 are received in the second cavity 7214. The heat generated while the primary heating element 715 is operating causes the temperature in the second cavity 7214 to increase. Since the hot air has a low density, the hot air naturally flows upwardly and enters the first cavity 7212 through the first air vent 764 located at the top of the second cavity 7214. The hot air contacts the heat dissipation member 6 and exchanges heat with the heat dissipation member 6. The temperature of the hot air decreases, and the density of the air increases. The air naturally flows downwardly to a bottom of the first cavity 7212 under the gravitational force. Further, the air enters the second cavity 7214 through the second air vent 766 to cool the primary heating element 715. After exchanging heat with the primary heating element 715, the hot air flows upwardly to the position where the first air vent 764 is defined. In this way, an internal circulating airflow between the first cavity 7212 and the second cavity 7214 is generated.

In the present embodiment, the mounting plate 76 defines the first air vent 764 and the second air vent 766. The first air vent 764 and the second air vent 766 are communicated with the first cavity 7212 and the second cavity 7214, and are arranged in the vertical direction. The air may circulate between the first cavity 7212 and the second cavity 7214 due to the gravitational force applied to the air, and the air may cool down the electronic elements 71 received in the second cavity 7214, and an overall temperature of the electric control box 7 may be reduced. Compared to taking the cooling fan 78 to supply air, the structure of the electric control box 7 in the present embodiment may be simpler, an assembling efficiency of the electric control box 7 may be increased, and the production cost of the electric control box 7 may be reduced.

Further, the heat dissipation member 6 may be arranged on an upper of the primary heating element 715 along the gravitation direction. That is, the heat dissipation member 6 may be arranged at a position near the top of the first cavity 7212, and the primary heating element 715 may be arranged at a position near the bottom of the second cavity 7214. In this way, a distance between the heat dissipation member 6 and the first air vent 764 may be reduced, and the hot air entering the first cavity 7212 via the first air vent 764 may contacts the heat dissipation member 6 and may be cooled quickly. The cooled air may naturally flow downwardly due to the gravitational force. By reducing the distance between the primary heating element 715 and the second air vent 766, the hot air entering the second cavity 7214 through the second air vent 766 may contact the primary heating element 715 and may be heated quickly, and the heated air may flow upwardly due to air buoyancy. In this way, the speed that the air circulates in the electric control box 7 may be increased, and the heat dissipation efficiency may be improved.

Further, as shown in FIG. 33, the secondary heating element 716 may be arranged inside the electric control box 7. The secondary heating element 716 may be received in the second cavity 7214 and may be thermal-conductively connected to the heat exchanging body 61.

The amount of heat generated by the secondary heating element 716 may be less than the amount of heat generated by the primary heating element 715.

In detail, in the present embodiment, the primary heating element 715, which generates a large amount of heat, may be arranged near the second air vent 766. On one hand, the cold air entering through the first cavity 7212 may firstly contact the electronic element 71, which generates the large amount of heat, to improve the efficiency of dissipating heat from the electronic element 71. On the other hand, a large temperature difference may be generated between the cold air and the electronic element 71 which generates the large amount of heat, and the cold air may be heated quickly and flow upwardly due to the air buoyancy. The secondary heating element 716, which generates less amount of heat, may be arranged on and contact the heat exchanging body 61. The heat exchanging body 61 may be configured to directly cool the electronic element 71, which generates less amount of heat. In this way, the primary heating element 715, which generates large amount of heat, and the secondary heating element 716, which generates less amount of heat, may be disposed in different regions, the electronic elements 71 may be distributed more reasonably, and the internal space of the electric control box 7 may be optimally utilized.

In some embodiments, the secondary heating element 716 is connected to the heat exchanging body 61 through the heat dissipation fixing plate 74, and the efficiency of assembling the secondary heating element 716 may be improved.

Connection between the secondary heating element 716 and the heat exchanging body 61 may be the same as and may be referred to the description of the above-mentioned embodiments, and will not be repeated herein.

In some embodiments, the heat dissipation member 6 may be arranged on the outside of the electric control box 7, and at least a part of the heat dissipation member 6 may extend to the inside the first cavity 7212.

Engagement between the heat dissipation member 6 and the electric control box 7 may be the same as and referred to the description of the above-mentioned embodiments, and will not be repeated herein.

Structures in the above various embodiments may be combined with each other. It shall be understood that, the heat dissipation members 6 as described in the above may be applied in the embodiments, heat dissipation members 6 in other forms may be applied. The present disclosure does not limit the structure of heat dissipation member 6 applied in the embodiments.

The above description shows only embodiments of the present disclosure, and does not limit the scope of the present disclosure. Any equivalent structure or equivalent process transformation performed based on the specification and accompanying drawings, applied directly or indirectly in other related fields, shall be equally covered by the scope of the present disclosure.

What is claimed is:
1. An electric control box, comprising:
  a box body, defining a mounting cavity;
  a mounting plate, received in the mounting cavity to divide the mounting cavity into a first chamber and a second chamber, wherein the first chamber and the second chamber are disposed on two sides of the mounting plate respectively;
  an electronic element, received in a second cavity; and
  a heat dissipation member, comprising a heat exchanging body and a fluid-collecting tube assembly, wherein the fluid-collecting tube assembly is configured to provide a cooling medium to the heat exchanging body, at least part of the heat exchanging body is received in the first cavity and is thermal-conductively connected to the electronic element, the mounting plate is configured to prevent condensed water on the heat dissipation member from flowing into the second cavity.

2. The electric control box according to claim 1, further comprising a heat dissipation fixing plate, wherein the heat dissipation fixing plate is arranged on the heat exchanging body.

3. The electric control box according to claim 2, wherein the mounting plate defines an avoidance hole, the heat dissipation fixing plate blocks the avoidance hole, and the electronic element is disposed on a side of the heat dissipation fixing plate away from the heat exchanging body.

4. The electric control box according to claim 1, further comprising low guiding plate, wherein the flow guiding plate is arranged on a lower side of the heat dissipation member and is configured to collect condensed water dropping from the heat dissipation member.

5. The electric control box according to claim 4, wherein an end of the flow guiding plate is connected to the box body or the mounting plate, and the other end of the flow guiding plate extends towards an interior of the first cavity; and a projection of the heat dissipation member along a vertical direction falls within the flow guiding plate.

6. The electric control box according to claim 4, wherein a bottom wall of the box body defines a drainage opening, the flow guiding plate is inclined respect to the bottom wall of the box body, and the condensed water is guided by the flow guiding plate and discharged out of the box body through the drainage opening.

7. The electric control box according to claim 1, wherein a flowing direction of the cooling medium in the heat exchanging body is configured to be along a horizontal direction.

8. The electric control box according to claim 1, wherein the heat exchanging body defines a first heat exchanging channel and a second heat exchanging channel;
the fluid-collecting tube assembly comprising a first fluid-collecting tube and a second fluid-collecting tube;
a first fluid-collecting channel is configured to provide a first cooling medium to the first heat exchanging channel and/or to collect the first cooling medium that flows through the first heat exchanging channel;
the second fluid-collecting tube defines a second fluid-collecting channel, the second fluid-collecting channel is configured to provide a second cooling medium to the second heat exchanging channel and/or to collect the second cooling medium that flows through the second heat exchanging channel;
heat is exchanged between the first cooling medium that flows through the first heat exchanging channel and a second cooling medium that flows through the second heat exchanging channel; and
the second cooling medium absorbs heat from the first cooling medium to sub-cool the first cooling medium, while the second cooling medium is flowing along the second heat exchanging channel, or the first cooling medium absorbs heat from the second cooling medium to sub-cool the second cooling medium, while the first cooling medium is flowing along the first heat exchanging channel.

9. The electric control box according to claim 8, wherein the first heat exchanging channel refers to a plurality of first micro-channels defined in the heat exchanging body, and the second heat exchanging channel refers to a plurality of second micro-channels defined in the heat exchanging body.

10. The electric control box according to claim 9, wherein the heat exchanging body comprises a first plate body and a second plate body, the first plate body and the second plate body are laminated on each other; and
the plurality of first micro-channels are defined in the first plate body, and the plurality of second micro-channels are defined in the second plate body.

11. The electric control box according to claim 9, wherein a number of first plate bodies is two, a second plate body is clamped between the two first plate bodies, the electronic element is thermal-conductively connected to the first plate bodies; or
a number of second plate bodies is two, the first plate body is clamped between the two second plate bodies, the electronic element is thermal-conductively connected to the second plate bodies.

12. The electric control box according to claim 1, wherein the heat exchanger has a cross section along a direction that the cooling medium flows in the heat exchanging body, and the cross section is I shaped, L shaped, U shaped, or G shaped.

13. An air conditioning apparatus, comprising an air conditioning body and an electric control box, wherein the electric control box is detachably connected to the air conditioning body, and
wherein the electric control box comprises:
a box body, defining a mounting cavity;
a mounting plate, received in the mounting cavity to divide the mounting cavity into a first chamber and a second chamber, wherein the first chamber and the second chamber are disposed on two sides of the mounting plate respectively;
an electronic element, received in a second cavity; and
a heat dissipation member, comprising a heat exchanging body and a fluid-collecting tube assembly, wherein the fluid-collecting tube assembly is configured to provide a cooling medium to the heat exchanging body, at least part of the heat exchanging body is received in the first cavity and is thermal-conductively connected to the electronic element, the mounting plate is configured to prevent condensed water on the heat dissipation member from flowing into the second cavity.

\* \* \* \* \*